United States Patent
Kim et al.

(10) Patent No.: US 11,818,879 B2
(45) Date of Patent: *Nov. 14, 2023

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Cheonbae Kim, Hwaseong-si (KR); Seungjin Kim, Hwaseong-si (KR); Dongkyun Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/901,210

(22) Filed: Sep. 1, 2022

(65) Prior Publication Data

US 2023/0005917 A1    Jan. 5, 2023

Related U.S. Application Data

(62) Division of application No. 17/320,711, filed on May 14, 2021, now Pat. No. 11,462,543.

(30) Foreign Application Priority Data

Oct. 12, 2020 (KR) .................... 10-2020-0131281

(51) Int. Cl.
| | |
|---|---|
| *H01L 27/108* | (2006.01) |
| *H01L 49/02* | (2006.01) |
| *H01L 29/78* | (2006.01) |
| *H10B 12/00* | (2023.01) |

(52) U.S. Cl.
CPC ............ *H10B 12/30* (2023.02); *H01L 28/60* (2013.01); *H01L 29/7802* (2013.01)

(58) Field of Classification Search
CPC .... H10B 12/30; H10B 12/033; H10B 12/315; H10B 12/03; H10B 12/31; H01L 28/60; H01L 29/7802; H01L 28/90; H01L 29/24; H01L 29/7827; H01L 28/91
See application file for complete search history.

(56) References Cited

U.S. PATENT DOCUMENTS

| | | | |
|---|---|---|---|
| 7,749,895 B2 | 7/2010 | Kong | |
| 7,951,668 B2 | 5/2011 | Wu et al. | |
| 8,796,085 B2 | 8/2014 | Koldiaev et al. | |
| 8,872,183 B2 | 10/2014 | Chang et al. | |
| 9,373,681 B2 | 6/2016 | Lim et al. | |

(Continued)

FOREIGN PATENT DOCUMENTS

KR    10-0622284 B1    9/2006

OTHER PUBLICATIONS

Communication dated Oct. 21, 2022 by the Taiwan Patent Office in TW Patent Application No. 110137445.

*Primary Examiner* — David Vu
(74) *Attorney, Agent, or Firm* — Sughrue Mion, PLLC

(57) ABSTRACT

A semiconductor device is provided. The semiconductor device includes a plurality of lower electrodes arranged on a semiconductor substrate in a honeycomb structure; and a support connected to the plurality of lower electrodes and defining a plurality of open areas through which the plurality of lower electrodes are exposed. A center point of each of the plurality of open areas is arranged at a center point of a triangle formed by center points of three corresponding neighboring lower electrodes among the plurality of lower electrodes.

20 Claims, 25 Drawing Sheets

(56) References Cited

U.S. PATENT DOCUMENTS

| | | |
|---|---|---|
| 9,240,442 B2 | 7/2016 | Lim et al. |
| 10,276,668 B2 | 4/2019 | Kim |
| 2009/0108402 A1 | 4/2009 | Bae et al. |
| 2020/0035782 A1 | 1/2020 | Feng et al. |

SEMICONDUCTOR DEVICE AND METHOD OF FABRICATING THE SAME

CROSS-REFERENCE TO THE RELATED APPLICATION

This application is a Divisional application of U.S. application Ser. No. 17/320,711, filed on May 14, 2021, which claims priority from Korean Patent Application No. 10-2020-0131281, filed on Oct. 12, 2020 in the Korean Intellectual Property Office, the disclosures of which are incorporated herein by reference in their entireties.

BACKGROUND

Methods, apparatuses and systems consistent with example embodiments relate to a semiconductor device and a method of fabricating the same, and more particularly, to a semiconductor device including a support which prevents lower electrodes from bending and a method of fabricating the same.

Recently, as semiconductor devices are increasingly integrated, for example due to the breakthrough of micronized semiconductor process technology, a unit cell area is reduced. Therefore, an area that may be occupied by a capacitor in a unit cell is also reduced. For example, in a semiconductor device such as dynamic random access memory (DRAM), the area occupied by the unit cell is reduced as a degree of integration increases. Moreover, required capacitance is maintained or increases. Due to the reduced area and capacitance requirements, an aspect ratio of the lower electrodes configuring the capacitor significantly increases. Therefore, the lower electrodes may fall or bend before forming a dielectric layer.

SUMMARY

Methods, apparatuses and systems consistent with example embodiments relate to a semiconductor device including a support in which all lower electrodes are exposed in order to smoothly perform a subsequent process while preventing the lower electrodes from bending and a method of fabricating the same.

An object to be achieved by example embodiments is not limited thereto and other objects that are not described will be clearly understood to those skilled in the art.

According to an aspect of an example embodiment, a semiconductor device includes a plurality of lower electrodes arranged on a semiconductor substrate in a honeycomb structure; and a support connected to the plurality of lower electrodes and defining a plurality of open areas through which the plurality of lower electrodes are exposed. A center point of each of the plurality of open areas is arranged at a center point of a triangle formed by center points of three corresponding neighboring lower electrodes among the plurality of lower electrodes.

According to an aspect of an example embodiment, a semiconductor device includes a plurality of lower electrodes provided on an upper surface of a semiconductor substrate and arranged in a first direction and a second direction intersecting each other, wherein the first direction and the second direction are parallel to the upper surface; and a support connected to the plurality of lower electrodes and defining a plurality of open areas. A support pattern is repeatedly formed in the support, and three segments of each of the plurality of lower electrodes are exposed by the plurality of open areas.

According to an aspect of an example embodiment, a semiconductor device includes a plurality of first conductive lines, wherein the plurality of first conductive lines are spaced apart from one another in a first direction and a second direction, the first direction and the second direction being parallel with an upper surface of a semiconductor substrate and the second direction intersecting with the first direction; channel layers arranged in a matrix on the plurality of first conductive lines and spaced apart from one another in the first direction and the second direction; gate electrodes disposed on both side walls of each of the channel layers that extend in the first direction; gate insulating layers surrounding side walls of the channel layers and arranged between the channel layers and the gate electrodes; a plurality of capacitors arranged on the channel layers, each of which includes a lower electrode, a dielectric layer, and an upper electrode; and a support connected to the plurality of lower electrodes and defining a plurality of open areas through which the plurality of lower electrodes are exposed. A center point of each of the plurality of open areas is arranged at a center point of a triangle formed by center points of three corresponding neighboring lower electrodes among the plurality of lower electrodes.

According to an aspect of an example embodiment, a method of fabricating a semiconductor device includes: forming contact plugs on a semiconductor substrate; forming a mold layer and a support forming layer on the contact plugs; forming a plurality of open areas which expose the contact plugs by etching the mold layer and the support forming layer; forming a plurality of lower electrodes along internal walls of the plurality of open areas; and forming a support which contacts the plurality of lower electrodes by etching the support forming layer to define the plurality of open areas through an extreme ultraviolet (EUV) process of reflecting EUV light from an EUV photomask. A center point of each of the plurality of open areas is arranged at a center point of a triangle formed by center points of three corresponding neighboring lower electrodes among the plurality of lower electrodes.

BRIEF DESCRIPTION OF THE DRAWINGS

The above and other aspects, features and advantages will become more clearly understood from the following description of example embodiments with reference to the accompanying drawings in which.

DETAILED DESCRIPTION

Hereinafter, example embodiments will be described in detail with reference to the accompanying drawings.

FIGS. 1A, 1B, 1C and 1D are views illustrating a semiconductor device 100 according to an example embodiment.

Figure 1A:
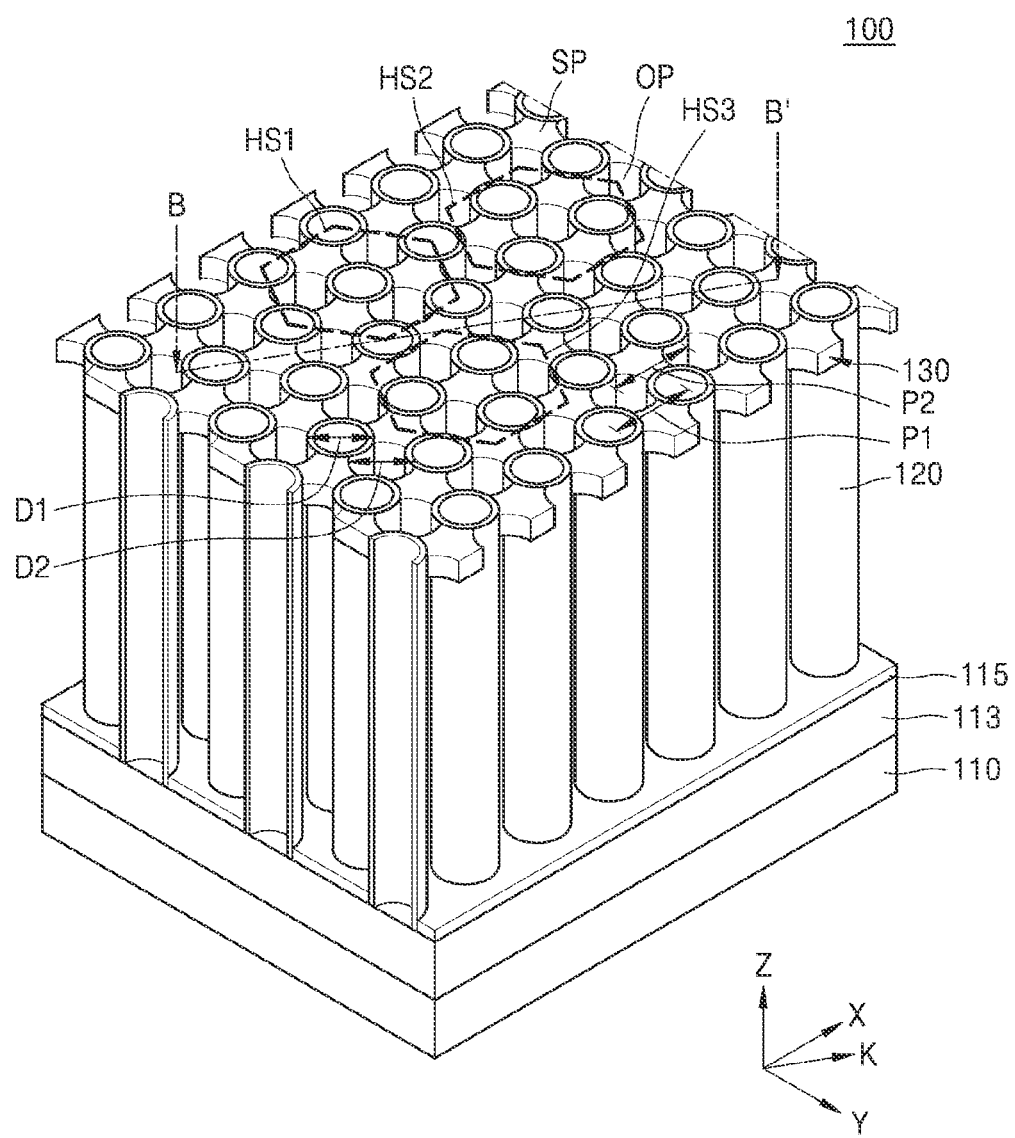
FIGS. 1A, 1B, 1C and 1D are views illustrating a semiconductor device according to an example embodiment.
Figure 1B:
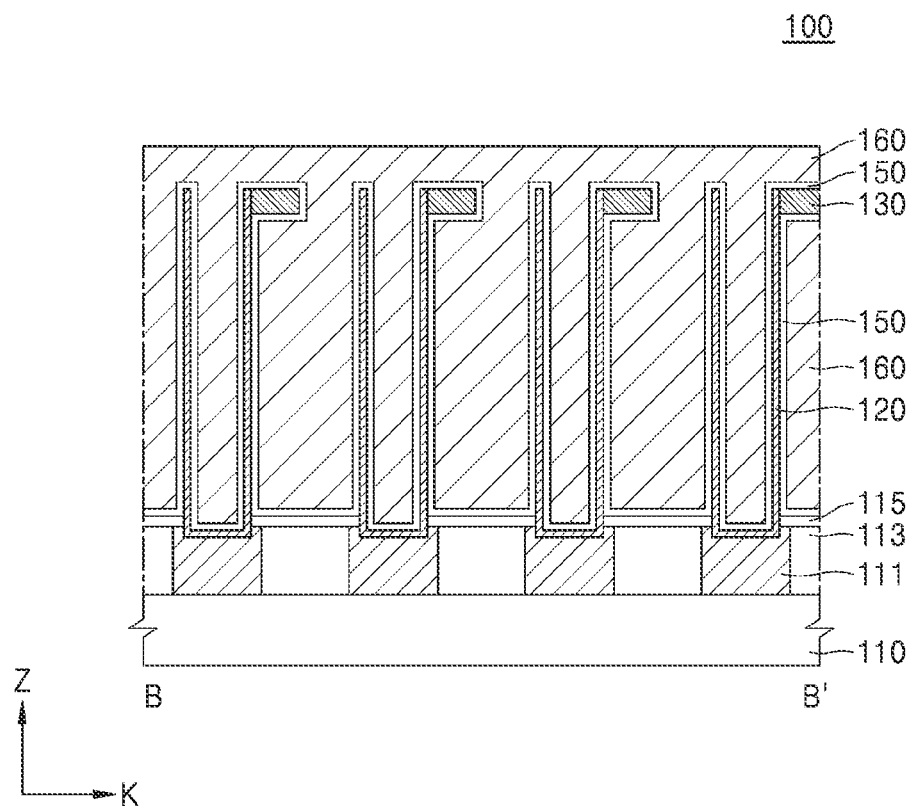
Figure 1C:
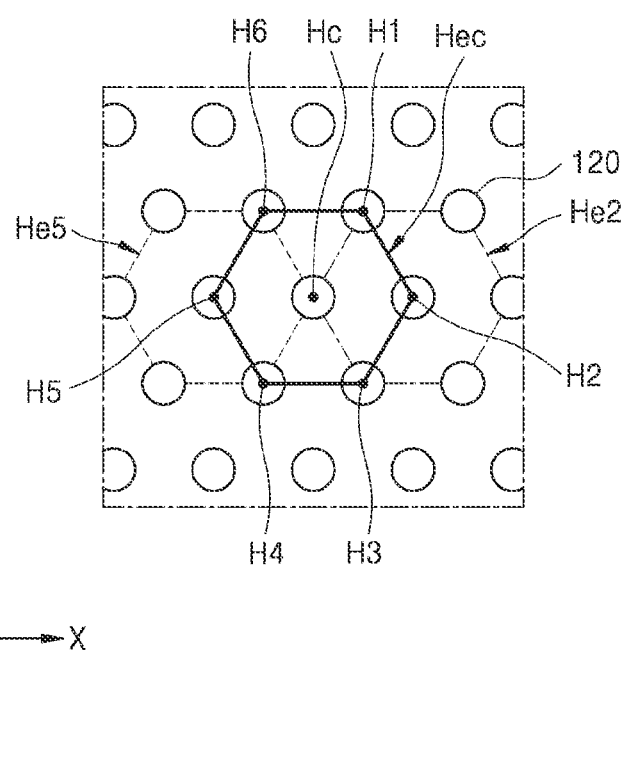
Figure 1D:
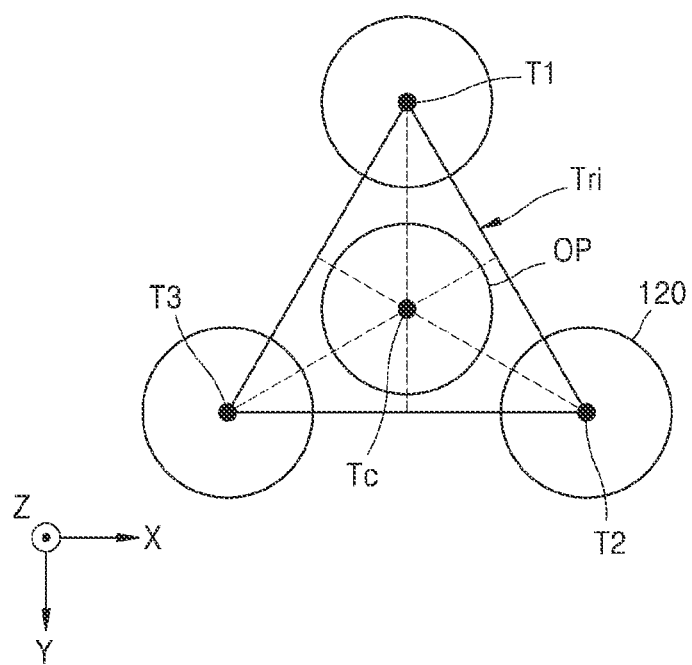

Specifically, FIG. 1A is a perspective view illustrating the semiconductor device 100, FIG. 1B is a cross-sectional view taken along the line B-B' of FIG. 1A, FIG. 1C is a plan view illustrating an arrangement of a honeycomb structure, and FIG. 1D is a plan view illustrating an arrangement of a triangular structure. For convenience sake, a dielectric layer 150 and an upper electrode 160 are not shown in FIG. 1A. FIGS. 1C and 1D are conceptually illustrated.

In addition, a first direction (an X direction) parallel with an upper surface of a semiconductor substrate 110, a second direction (a Y direction) parallel with the upper surface of the semiconductor substrate 110 and intersecting with the first direction (the X direction), a third direction (a Z direction) perpendicular to the upper surface of the semiconductor substrate 110, and a fourth direction (a K direction) between the first direction (the X direction) and the second direction (the Y direction) may be defined.

Referring to FIGS. 1A, 1B, 1C and 1D, the semiconductor device 100 including a plurality of lower electrodes 120 arranged on the semiconductor substrate 110 in a honeycomb structure and a support 130 having a plurality of open areas OP is illustrated.

The semiconductor substrate 110 may be formed of a semiconductor material such as silicon (Si) or germanium (Ge). In some example embodiments, the semiconductor substrate 110 may include a compound semiconductor material such as SiGe, SiC, GaAs, InAs, or InP. In other example embodiments, the semiconductor substrate 110 may have a silicon on insulator (SOI) structure. The semiconductor substrate 110 may include an active area, for example, a well doped with impurities or a structure doped with impurities. In addition, the semiconductor substrate 110 may have various isolation structures such as a shallow trench isolation (STI) structure.

Contact plugs 111 and an interlayer insulating layer 113 surrounding the contact plugs 111 may be arranged on the semiconductor substrate 110. Each of the contact plugs 111 may have a conductive structure including a metal. The metal may include copper (Cu), tungsten (W), aluminum (Al), cobalt (Co), or ruthenium (Ru). In some example embodiments, the contact plugs 111 may be electrically connected to the active area formed on the semiconductor substrate 110. The interlayer insulating layer 113 may include a silicon series insulating material such as silicon oxide, silicon nitride or silicon oxynitride. However, example embodiments are not limited thereto.

An etch stop pattern 115 may surround external walls of lower ends of the plurality of lower electrodes 120 on parts of upper surfaces of the contact plugs 111 and on an upper surface of the interlayer insulating layer 113.

The semiconductor device 100 may include a charge storage, for example, a capacitor. In order to increase the capacitance of the capacitor, the plurality of lower electrodes 120 respectively corresponding to storage electrodes may be cylindrical. However, example embodiments are not limited thereto. The plurality of lower electrodes 120 may be pillar-shaped or, in each of the plurality of lower electrodes 120, a pillar-shaped lower electrode may be arranged under a cylindrical lower electrode, which will be described in detail later.

The plurality of lower electrodes 120 may be arranged in the first direction (the X direction) and the second direction (the Y direction) and may form a plurality of rows and columns. In order to secure spaces among the plurality of lower electrodes 120, lower electrodes 120 forming one row may be shifted with respect to lower electrodes 120 forming another neighboring row. That is, X coordinate values of lower electrodes 120 in one row may be different from those of lower electrodes 120 in another neighboring row. As described above, the plurality of lower electrodes 120 are shifted with respect to one another so that wide spaces may be secured among the plurality of lower electrodes 120 and the dielectric layer 150 may be uniformly formed in a subsequent process. In addition, the plurality of lower electrodes 120 may be arranged at vertexes and a center point of a hexagon to form a honeycomb structure. For example, the smallest hexagon formed by six neighboring lower electrodes 120 sharing the center point among the plurality of lower electrodes 120 may be referred to as a first hexagonal structure HS1.

In FIG. 1C, an arrangement of the plurality of lower electrodes 120 is taken as an example. However, the honeycomb structure may also be applied to the plurality of open areas OP and a plurality of support patterns SP.

In the honeycomb structure, the plurality of lower electrodes 120 may be arranged at first to sixth vertexes H1, H2, H3, H4, H5, and H6 and a center point Hc. As illustrated in FIG. 1C, the plurality of lower electrodes 120 may also be arranged in the first direction (the X direction) and the second direction (the Y direction) in a structure in which honeycomb structures continuously overlap.

Specifically, the plurality of lower electrodes 120 may be arranged in a structure in which the first to sixth vertexes H1, H2, H3, H4, H5, and H6 of a center hexagon Hec (marked with a solid line) respectively correspond to center points of six neighboring hexagons and the center point Hc of the center hexagon Hec is shared by the six hexagons.

For example, the second vertex H2 may become a center point of a second hexagon He2 (marked with a dashed line), the fifth vertex H5 may become a center point of a fifth hexagon He5 (marked with a dashed line), and the center point Hc of the center hexagon Hec may be shared as one of six vertexes of each of the second hexagon He2 and the fifth hexagon He5.

Here, in the honeycomb structure of the plurality of lower electrodes 120, the hexagon may be a regular hexagon. In addition, six triangles sharing the center point Hc of the hexagon may be equilateral triangles. Therefore, in one hexagon, neighboring vertexes or a vertex and a center point may be arranged at equal intervals.

In FIG. 1C, the plurality of lower electrodes 120 are not represented as two concentric circles as illustrated in FIG. 1A and are represented as one circle for convenience sake. In the semiconductor device 100, each of the plurality of lower electrodes 120 may have a predetermined thickness as illustrated in FIG. 1A.

In each of the plurality of lower electrodes 120, an aspect ratio that is a ratio between a height in the third direction (the Z direction) and a first diameter D1 along an X-Y plane may be remarkably large. For example, the aspect ratio of each of the plurality of lower electrodes 120 may be about 10 to about 30. In addition, the first diameter D1 of each of the plurality of lower electrodes 120 may be about 20 nm to about 100 nm and the height of each of the plurality of lower electrodes 120 in the third direction (the Z direction) may be about 500 nm to about 4,000 nm. The structure of each of the plurality of lower electrodes 120 is not limited thereto.

As described above, as the aspect ratio of each of the plurality of lower electrodes 120 increases, when the plurality of lower electrodes 120 are formed, the plurality of lower electrodes 120 may fall or bend. Therefore, the semiconductor device 100 may include the support 130 in order to prevent the plurality of lower electrodes 120 from falling or bending.

The support 130 may include an insulating layer, for example, silicon oxide, silicon nitride, or silicon oxynitride. The support 130 may define the plurality of open areas OP and include the plurality of support patterns SP. The plurality of open areas OP and the plurality of support patterns SP are arranged with a predetermine rule, and one open area OP may be arranged to expose three lower electrodes 120 corresponding to the one open area OP.

Here, that the one open area OP of the support 130 "exposes" the three lower electrodes 120 describes a structure of the support 130 before the dielectric layer 150 is formed. After the dielectric layer 150 and the upper electrode 160 are formed, because the three lower electrodes 120 are covered with the dielectric layer 150 and the upper electrode 160, the three lower electrodes 120 may not be exposed through the one open area OP The one open area OP means an exposed area in the support 130 in the form of a flat plate, that is, an area that does not contact the support 130 in the three lower electrodes 120 and does not mean an actually exposed area in the final structure of the semiconductor device 100.

In the support 130, the plurality of support patterns SP may be arranged on the external walls of upper ends of the plurality of lower electrodes 120. Therefore, as illustrated in FIG. 1A, upper surfaces of the plurality of lower electrodes 120 may be exposed through the support 130.

The one open area OP may expose a portion of each of the three lower electrodes 120, for example, a portion of a side surface of each of the three lower electrodes 120. In accordance with a diameter of the one open area OP, an area of the external walls of the three lower electrodes 120 exposed through the one open area OP may vary.

As illustrated in FIG. 1D, a center point Tc of the one open area OP may be arranged in a center of gravity of a triangle Tri formed by center points T1, T2, and T3 of three neighboring lower electrodes 120 among the plurality of lower electrodes 120. That is, distances from the center points T1, T2, and T3 of the three neighboring lower electrodes 120 to the center point Tc of the open area OP may be equal to each other.

In FIG. 1D, the open area OP and the lower electrodes 120 do not overlap and are represented as spaced circles, but example embodiments are not limited thereto. For example, in the semiconductor device 100, the open area OP and the lower electrodes 120 may be arranged to partially overlap as illustrated in FIG. 1A.

Furthermore, the plurality of open areas OP may be arranged at hexagonal vertexes and a center point to form another honeycomb structure. That is, the smallest hexagon formed by six neighboring open areas OP sharing the center point among the plurality of open areas OP may be referred to as a second hexagonal structure HS2. Description of the arrangement of the honeycomb structure of the plurality of open areas OP is previously made.

The plurality of lower electrodes 120 may be formed in the first direction (the X direction) with a first pitch P1, the plurality of open areas OP may be formed in the first direction (the X direction) with a second pitch P2, and the first pitch P1 and the second pitch P2 may be equal to each other. Here, the plurality of lower electrodes 120 may be arranged in the first direction (the X direction) with the first pitch P1 or may be shifted with respect to each other in the second direction (the Y direction) by a half of the first pitch P1.

A diameter of a virtual circle formed by each of the plurality of open areas OP may be defined as a second diameter D2. In this case, the first diameter D1 of each of the plurality of lower electrodes 120 may be equal to the second diameter D2 of each of the plurality of open areas OP. Such a characteristic may be caused by forming the plurality of lower electrodes 120 and the plurality of open areas OP using the same extreme ultraviolet (EUV) process. However, example embodiments are not limited thereto, and only the plurality of open areas OP may be fabricated by the EUV process.

The plurality of lower electrodes 120 and the plurality of open areas OP may be arranged to satisfy the following relationship. Three segments of one lower electrode 120 selected from the plurality of lower electrodes 120 may be exposed by the three open areas OP among the plurality of open areas OP in different directions, for example, at angles of 120° in a clockwise direction. One open area OP selected from the plurality of open areas OP may be occluded by the three lower electrodes 120 in different directions, for example, at angles of 120° in a clockwise direction.

Assuming that a distance between center points of two neighboring lower electrodes 120 among the plurality of lower electrodes 120 is 3.0 minimum lithographic feature sizes (F), a distance between center points of the neighboring open areas OP may be about 3.0 F in the first direction (the X direction) and may be about 2.6 F in the second direction (the Y direction).

A first area occupied by the first hexagonal structure HS1 formed by the center points of the plurality of lower electrodes 120 may be equal to a second area occupied by the second hexagonal structure HS2 formed by the center points of the plurality of open areas OP. That is, in a unit area, a ratio between the number of lower electrodes 120 and the number of open areas OP may be 1:1.

The support 130 may repeatedly include the same support patterns SP. The plurality of support patterns SP may be arranged at vertexes and a center point of a hexagon to form a honeycomb structure That is, the smallest hexagon formed by six neighboring support patterns SP sharing the center point among the plurality of support patterns SP may be referred to as a third hexagonal structure HS3. Description of the arrangement of the honeycomb structure of the plurality of support patterns SP is previously made.

In addition, each of the plurality of support patterns SP includes six side surfaces and three side surfaces contacting the plurality of lower electrodes 120 and three side surfaces contacting the plurality of open areas OP may be alternately arranged in a clockwise direction.

Therefore, in the semiconductor device 100, the plurality of lower electrodes 120, the plurality of open areas OP, and the plurality of support patterns SP may have honeycomb structures with the same size.

For reference, as the number of exposed lower electrodes 120 increases, a subsequent process such as a process of forming the dielectric layer 150 may be smoothly and uniformly performed. To the contrary, as the number of exposed lower electrodes 120 is reduced, it may be difficult to smoothly and uniformly perform a subsequent process. That is, as the number of lower electrodes 120 that are not exposed increases, the dielectric layer 150 may be incompletely and unevenly formed on the lower electrodes 120. Therefore, the performance or reliability of the semiconductor device 100 may deteriorate.

According to example embodiments, by providing the support 130 including the plurality of open areas OP exposing the three lower electrodes 120, the support 130 with a high open ratio may be implemented. Therefore, because a defective rate of the semiconductor device 100 may be reduced by smoothly performing a subsequent process, productivity may be improved.

In addition, according to example embodiments, by implementing a fabricating process of forming the plurality of open areas OP in the support 130 by using an extreme ultraviolet (EUV) exposure apparatus, an ultrafine process may be implemented so that the reliability of the semiconductor device 100 may be improved.

As a result, according to example embodiments, by implementing the support 130 connecting and supporting the plurality of lower electrodes 120 and having the plurality of open areas OP exposing parts of the plurality of lower electrodes 120 by using the EUV exposure apparatus, the reliability and productivity of the semiconductor device 100 may be improved through a smooth and uniform subsequent process.

Figure 2:
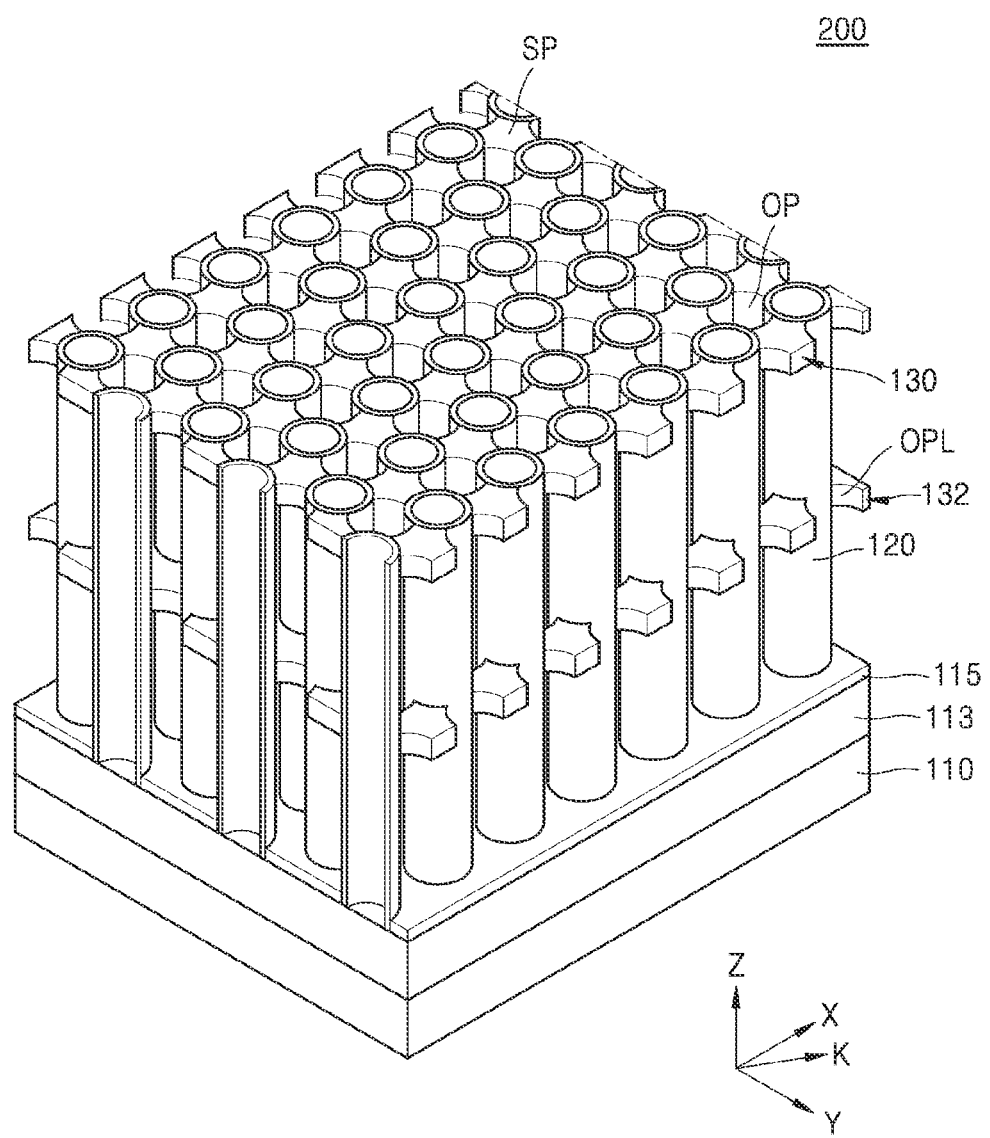
FIGS. 2 to 4 are views illustrating semiconductor devices according to an example embodiment.
Figure 3:
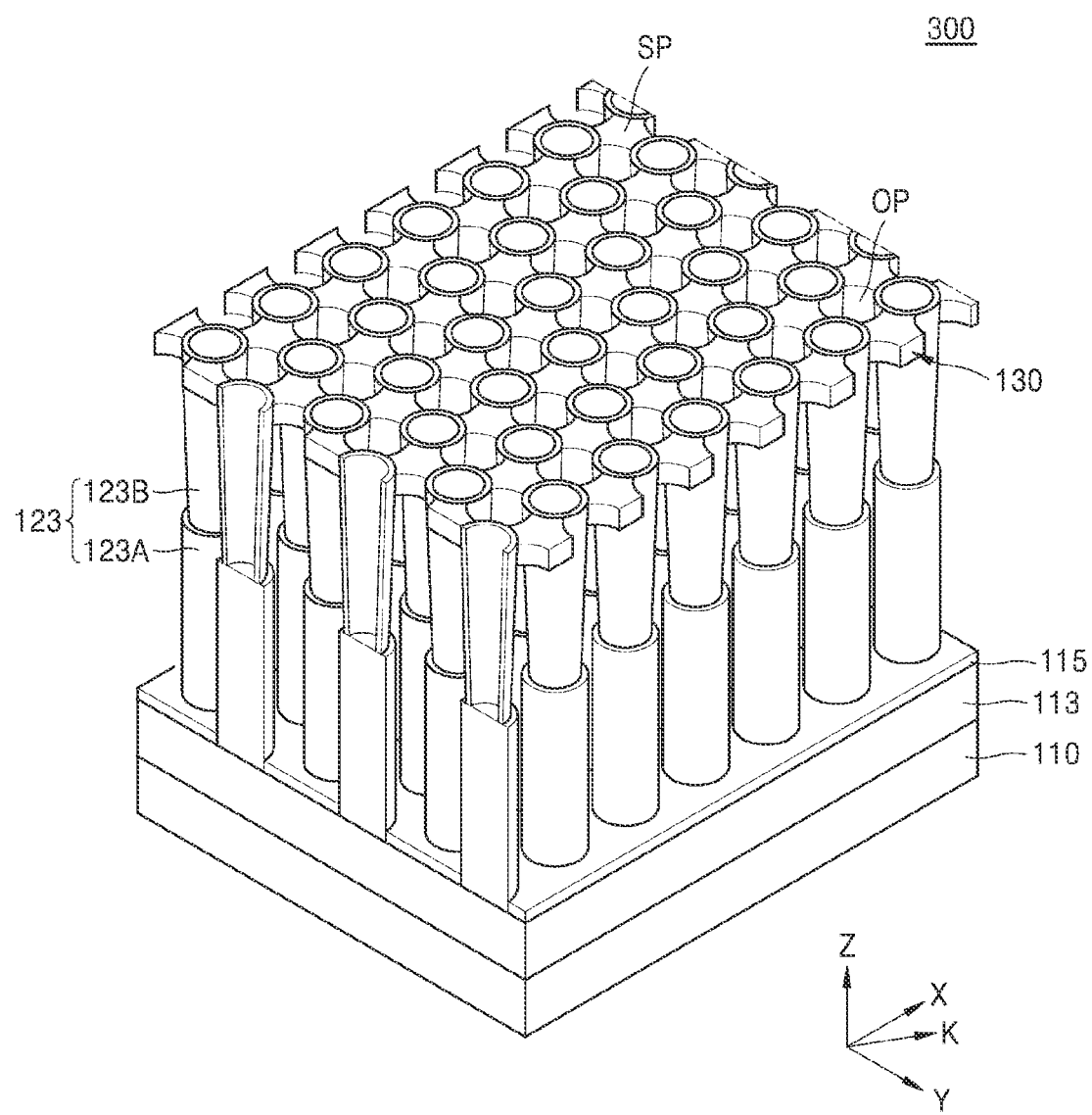
Figure 4:
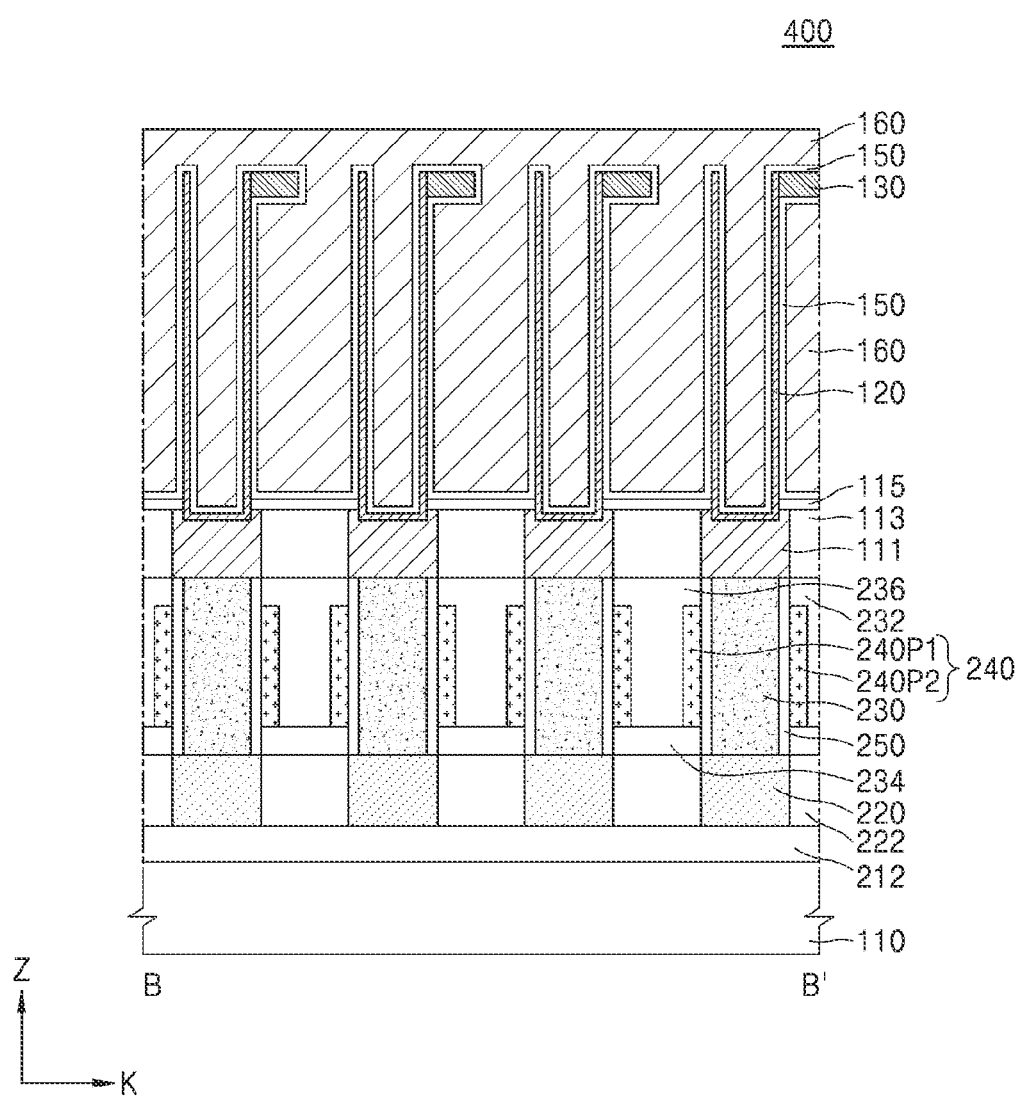

FIGS. 2 to 4 are views illustrating semiconductor devices 200, 300, and 400 according to example embodiments.

Specifically, FIG. 2 is a perspective view illustrating the semiconductor device 200, FIG. 3 is a perspective view illustrating the semiconductor device 300, and FIG. 4 illustrates the semiconductor device 400 corresponding to the cross-sectional view taken along the line B-B' of FIG. 1A.

Most components that configure the semiconductor devices 200, 300, and 400 and materials of which the components are formed, which are described hereinafter, are the same as or similar to those described with reference to FIGS. 1A, 1B, 1C and 1D. Therefore, for convenience sake, a difference between the semiconductor device 100 described above and the semiconductor devices 200, 300, and 400 will be mainly described.

Referring to FIG. 2, the semiconductor device 200 is the same as the semiconductor device 100 illustrated in FIG. 1 excluding a lower support 132.

The semiconductor device 200 according to the current example embodiment may include the lower support 132. That is, the semiconductor device 200 may further include the lower support 132 formed in a lower position (i.e., closer to the semiconductor substrate 110) than the support 130 in the third direction (the Z direction) in addition to the support 130 including the plurality of open areas OP.

The lower support 132 may be formed among the plurality of lower electrodes 120 and may contact at least parts of the plurality of lower electrodes 120. In some example embodiments, the lower support 132 may contact portions lower than ½ of a height of each of the plurality of lower electrodes 120 and the support 130 may contact upper ends of the plurality of lower electrodes 120. While the support 130 includes the plurality of open areas OP, the lower support 132 may include a plurality of lower open areas OPL. In some example embodiments, the plurality of open areas OP and the plurality of lower open areas OPL may overlap in the third direction (the Z direction).

The lower support 132 may include an insulating layer, for example, silicon oxide, silicon nitride, or silicon oxynitride. For example, the lower support 132 may include the same material as that of the support 130.

In some example embodiments, a width of each of the upper ends of the plurality of lower electrodes 120 may be greater than a width of each of lower ends of the plurality of lower electrodes 120. Therefore, intervals among the lower ends of the plurality of lower electrodes 120 adjacent to one another may be greater than intervals among the upper ends of the plurality of lower electrodes 120 adjacent to one another. Therefore, a width of the lower support 132 among the plurality of lower electrodes 120 adjacent to one another may be greater than a width of the support 130 among the plurality of lower electrodes 120 adjacent to one another.

In FIG. 2, the semiconductor device 200 is illustrated as including the support 130 and the lower support 132. However, example embodiments are not limited thereto. For example, the semiconductor device 200 may include three or more supports.

Referring to FIG. 3, the semiconductor device 300 is the same as the semiconductor device 100 illustrated in FIG. 1 excluding shapes of each of a plurality of lower electrodes 123.

In the semiconductor device 300, each of the plurality of lower electrodes 123 may have two different shapes. That is, each of the plurality of lower electrodes 123 may have a hybrid structure including a pillar-shaped lower electrode 123A and a cylindrical lower electrode 123B.

Lower ends of the pillar-shaped lower electrodes 123A may be supported by the etch stop pattern 115. In some example embodiments, a width of an upper end of the pillar-shaped lower electrode 123A may be greater than a width of a lower end of the cylindrical lower electrode 123B. In other example embodiments, the width of the upper end of the pillar-shaped lower electrode 123A may be equal to or less than the width of the lower end of the cylindrical lower electrode 123B.

A groove is provided in a surface of the upper end of the pillar-shaped lower electrode 123A, and the lower end of the cylindrical lower electrode 123B is provided in the groove so that the cylindrical lower electrode 123B may be stacked on the pillar-shaped lower electrode 123A. The cylindrical lower electrode 123B may be stacked on the pillar-shaped lower electrode 123A without having the groove provided in the surface of the upper end of the pillar-shaped lower electrode 123A.

A height of the pillar-shaped lower electrode 123A may be equal to a height of the cylindrical lower electrode 123B in the third direction (the Z direction). Alternatively, either the height of the pillar-shaped lower electrode 123A or the height of the cylindrical lower electrode 123B may be greater than the other one. A height of each of the plurality of lower electrodes 123 in the third direction (the Z direction) may be about 500 nm to about 4,000 nm. The height of each of the plurality of lower electrodes 123 is not limited thereto. The plurality of lower electrodes 123 may include at least one of metal nitride, metal, or a combination thereof.

When a capacitor is formed by adopting the plurality of lower electrodes 123 in which the plurality of pillar-shaped lower electrodes 123A and the plurality of cylindrical lower electrodes 123B are combined, greater charge capacity may be obtained than that obtained by a capacitor adopting only the plurality of pillar-shaped lower electrodes having the same height. In addition, when the capacitor is formed by adopting the plurality of lower electrodes 123 in which the plurality of pillar-shaped lower electrodes 123A and the plurality of cylindrical lower electrodes 123B are combined, a phenomenon in which the plurality of lower electrodes 123 fall or bend may occur less than in the capacitor adopting only the plurality of cylindrical lower electrodes having the same height.

Referring to FIG. 4, the semiconductor device 400 is the same as the semiconductor device 100 illustrated in FIG. 1 excluding that the semiconductor device 400 is a memory device including a vertical channel transistor (VCT).

The VCT may refer to a structure in which channel lengths of a plurality of channel layers 230 extend from a semiconductor substrate 110 in the third direction (the Z direction) that is a vertical direction.

The semiconductor device 400 may include a plurality of first conductive lines 220, the plurality of channel layers 230, a plurality of gate electrodes 240, and a plurality of gate insulating layers 250.

A lower insulating layer 212 may be arranged on the semiconductor substrate 110, and the plurality of first conductive lines 220 may be arranged on the lower insulating layer 212 to be spaced apart from one another in a fourth direction (a Kth direction) and to extend in a direction intersecting with the fourth direction (the Kth direction). A plurality of first insulating patterns 222 may be arranged on the lower insulating layer 212 to fill spaces between the plurality of first conductive lines 220. Upper surfaces of the plurality of first insulating patterns 222 may be at the same level as upper surfaces of the plurality of first conductive lines 220. The plurality of first conductive lines 220 may function as bit lines of the semiconductor device 400.

In some example embodiments, the plurality of first conductive lines 220 may include any one or any combination of doped polysilicon, metal, conductive metal nitride, conductive metal silicide, and conductive metal oxide. The plurality of first conductive lines 220 may include the above-described materials as a single layer or as multiple layers. In other example embodiments, the plurality of first conductive lines 220 may include a two-dimensional semiconductor material. For example, the two-dimensional semiconductor material may include graphene, carbon nanotube, or a combination of graphene and carbon nanotube.

The plurality of channel layers 230 may be arranged in a matrix on the plurality of first conductive lines 220 to be spaced apart from each other in the fourth direction (the Kth direction) and the direction intersecting with the fourth direction (the Kth direction). Each of the plurality of channel layers 230 may have a first width in the fourth direction (the Kth direction) and a first height in the third direction (the Z direction), and the first height may be greater than the first width. For example, the first height may be about 2 to 10 times the first width. However, example embodiments are not limited thereto.

Lower portions of the plurality of channel layers 230 may function as first source/drain areas, upper portions of the channel layers 230 may function as second source/drain areas, and portions of the plurality of channel layers 230 between the first source/drain areas and the second source/drain areas may function as channel areas.

The plurality of channel layers 230 may include an oxide semiconductor. For example, the oxide semiconductor may include any one or any combination of InGaZnO, InGaSiO, InSnZnO, InZnO, ZnO, ZnSnO, ZnON, ZrZnSnO, SnO, HfInZnO, GaZnSnO, AlZnSnO, YbGaZnO, and InGaO.

The plurality of channel layers 230 may include a single layer or multiple layers of the oxide semiconductor. In some example embodiments, the plurality of channel layers 230 may have band gap energy greater than band gap energy of silicon. For example, the plurality of channel layers 230 may have band gap energy of about 1.5 eV to about 5.6 eV. For example, the plurality of channel layers 230 may have optimal channel performance when the plurality of channel layers 230 have band gap energy of about 2.0 eV to about 4.0 eV. For example, the plurality of channel layers 230 may be polycrystalline or amorphous. However, example embodiments are not limited thereto. In other example embodiments, the plurality of channel layers 230 may include a two-dimensional semiconductor material. For example, the two-dimensional semiconductor material may include graphene, carbon nanotube, or a combination of graphene and carbon nanotube.

Each of the plurality of gate electrodes 240 may be arranged on both side walls of each of the plurality of channel layers 230. Each of the plurality of gate electrodes 240 may include a first sub-gate electrode 240P1 facing a first side wall of each of the plurality of channel layers 230 and a second sub-gate electrode 240P2 facing a second side wall opposite to the first side wall. As one channel layer 230 is arranged between the first sub-gate electrode 240P1 and the second sub-gate electrode 240P2, the semiconductor device 400 may have a dual gate transistor structure. However, example embodiments are not limited thereto. The second sub-gate electrode 240P2 may be omitted, and only the first sub-gate electrode 240P1 facing the first side wall of each of the plurality of channel layers 230 is formed so that a single gate transistor structure may be implemented.

The plurality of gate electrodes 240 may include any one or any combination of doped polysilicon, metal, conductive metal nitride, conductive metal silicide, and conductive metal oxide.

The plurality of gate insulating layers 250 surround side walls of the plurality of channel layers 230 and may be arranged between the plurality of channel layers 230 and the plurality of gate electrodes 240. For example, all the side walls of the plurality of channel layers 230 may be surrounded by the plurality of gate insulating layers 250 and partial side walls of the plurality of gate electrodes 240 may contact the plurality of gate insulating layers 250. In other example embodiments, the plurality of gate insulating layers 250 extend in a direction in which the plurality of gate electrodes 240 extend and only two side walls facing each of the plurality of gate electrodes 240 among the side walls of each of the plurality of channel layers 230 may contact each of the plurality of gate insulating layers 250.

The plurality of gate insulating layers 250 may include any one or any combination of silicon oxide, silicon oxynitride, and a high-k material having a higher dielectric constant than that of silicon oxide. The high-k material may include metal oxide or metal oxynitride.

A plurality of second insulating patterns 232 may be respectively arranged on the plurality of first insulating patterns 222, and each of the plurality of channel layers 230 may be arranged between two adjacent second insulating patterns 232 among the plurality of second insulating patterns 232. In addition, between the two adjacent second insulating patterns 232, in a space between two adjacent channel layers 230, a first burial layer 234 and a second burial layer 236 may be arranged. The first burial layer 234 may be arranged on a bottom of the space between two adjacent channel layers 230, and the second burial layer 236 may be formed on the first burial layer 234 to fill the remaining space between two adjacent channel layers 230. Upper surfaces of the plurality of second burial layers 236 may be at the same level as upper surfaces of the plurality of channel layers 230, and the plurality of second burial layers 236 may cover upper surfaces of the plurality of gate electrodes 240. Unlike as above, the plurality of second insulating patterns 232 may be formed as continuous material layers of the plurality of first insulating patterns 222 or the plurality of second burial layers 236 may be formed as continuous material layers of the plurality of first burial layers 234.

Contact plugs 111 may be arranged on the plurality of channel layers 230. The contact plugs 111 may be arranged in a matrix to correspond to the plurality of channel layers 230 and to vertically overlap the plurality of channel layers 230.

Figure 5A:
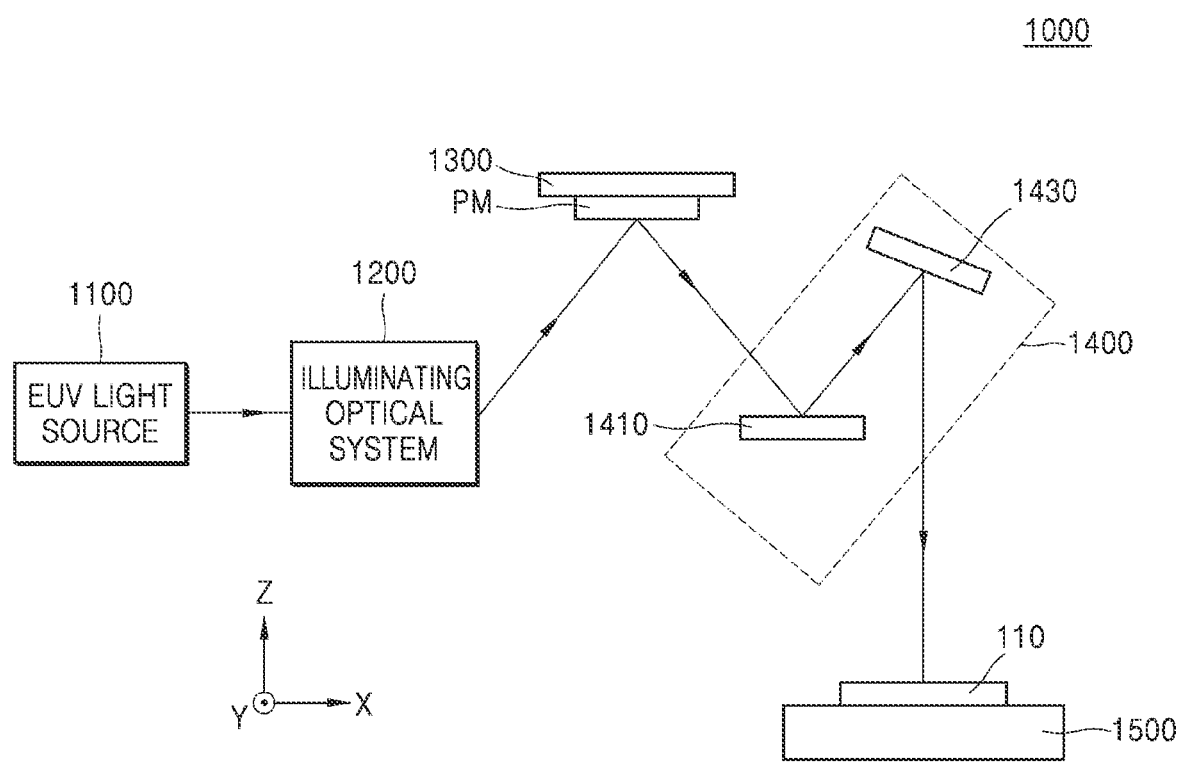
FIGS. 5A and 5B are block diagrams schematically illustrating an extreme ultraviolet (EUV) exposure apparatus according to an example embodiment.
Figure 5B:
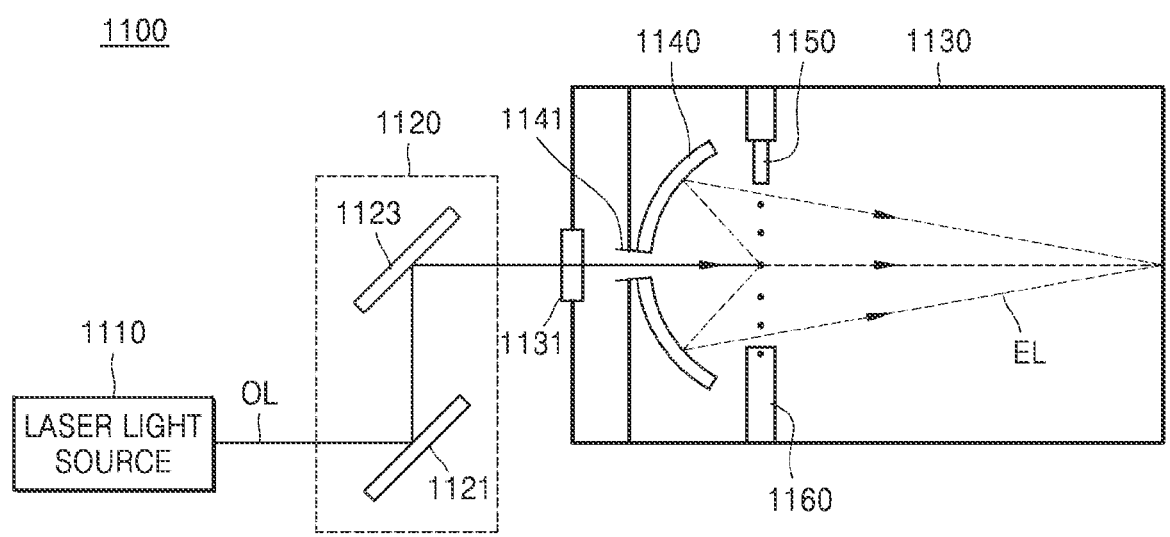

FIGS. 5A and 5B are block diagrams schematically illustrating an EUV exposure apparatus 1000 according to an example embodiment.

Referring to FIGS. 5A and 5B, the EUV exposure apparatus 1000 may include an EUV light source 1100, an illuminating optical system 1200, a photomask support 1300, a projective optical system 1400, and a substrate stage 1500.

The EUV light source 1100 may generate and output EUV light EL having high energy density. For example, the EUV light EL emitted from the EUV light source 1100 may have a wavelength of about 4 nm to about 124 nm. In some example embodiments, the EUV light EL may have a wavelength of about 4 nm to about 20 nm or about 13.5 nm.

The EUV light source 1100 may be a plasma-based light source or a synchrotron radiation light source. Here, the plasma-based light source generates plasma, indicates a light source using light emitted by plasma, and includes a laser produced plasma light source or a discharge produced plasma light source.

The EUV light source 1100 may include a laser light source 1110, a transmission optical system 1120, a vacuum chamber 1130, a collector mirror 1140, a droplet generator 1150, and a droplet catcher 1160.

The laser light source 1110 may output laser OL. For example, the laser light source 1110 may output $CO_2$ laser. The laser OL output from the laser light source 1110 may be incident on a window 1131 of the vacuum chamber 1130 through a plurality of reflective mirrors 1121 and 1123 included in the transmission optical system 1120 and may be introduced to the inside of the vacuum chamber 1130.

An aperture 1141 through which the laser OL may pass is formed in the center of the collector mirror 1140, and the laser OL may be introduced into the inside of the vacuum chamber 1130 through the aperture 1141 of the collector mirror 1140.

The droplet generator 1150 may generate a droplet and provide the generated droplet to the inside of the vacuum chamber 1130. The droplet may interact with the laser OL and generate the EUV light EL. The droplet may include any one or any combination of tin (Sn), lithium (Li), and xenon (Xe). For example, the droplet may include any one or any combination of Sn, an Sn compound (for example, $SnBr_4$, $SnBr_2$, or SnH), and an Sn alloy (for example, Sn—Ga, Sn—In, or Sn—In—Ga).

The droplet catcher 1160 may be arranged below the droplet generator 1150 and may catch the droplet that does not react with the laser OL. The droplet provided by the droplet generator 1150 may react with the laser OL introduced into the inside of the vacuum chamber 1130 and may generate the EUV light EL. The collector mirror 1140 may direct the EUV light EL to the illuminating optical system 1200 arranged outside the vacuum chamber 1130 by collecting and reflecting the EUV light EL.

The illuminating optical system 1200 may include the plurality of reflective mirrors and may transmit the EUV light EL emitted from the EUV light source 1100 to an EUV photomask PM. For example, the EUV light EL emitted from the EUV light source 1100 may be reflected from the plurality of reflective mirrors in the illuminating optical system 1200 and may be incident on the EUV photomask PM arranged on the photomask support 1300.

The EUV photomask PM may be a reflective mask including a reflective area and a non-reflective (or medium reflective) area. The EUV photomask PM may include a reflective multilayer formed on a mask substrate formed of a material having a low thermal expansivity such as Si and an absorption pattern formed on the reflective multilayer. Here, the reflective multilayer may correspond to the reflective area and the absorption pattern may correspond to the non-reflective (or medium reflective) area.

The EUV photomask PM may reflect the EUV light EL emitted by the illuminating optical system 1200 and to be incident on the projective optical system 1400. Specifically, the EUV photomask PM structuralizes light emitted by the illuminating optical system 1200 to projective light based on a pattern form formed by the reflective multilayer on the mask substrate and the absorption pattern, and causes the projective light to be incident on the projective optical system 1400. The projective light may be structuralized through at least a secondary order of diffraction due to the EUV photomask PM. The projective light may be incident on the projective optical system 1400 while keeping information on the pattern form of the EUV photomask PM and may pass through the projective optical system 1400 to form an image corresponding to the pattern form of the EUV photomask PM on the semiconductor substrate 110.

The projective optical system 1400 may include a plurality of reflective mirrors 1410 and 1430. In FIG. 5A, the two reflective mirrors 1410 and 1430 are illustrated in the projective optical system 1400 for convenience. However example embodiments are not limited thereto, and the projective optical system 1400 may include more reflective mirrors. For example, the projective optical system 1400 may include 4 to 8 reflective mirrors.

The semiconductor substrate 110 may be arranged on the substrate stage 1500. The substrate stage 1500 may move in the first direction (the X direction) and the second direction (the Y direction) on an X-Y plane or may move in the third direction (the Z direction) perpendicular to the X-Y plane. Due to the movement of the substrate stage 1500, the semiconductor substrate 110 may also move in the first direction (the X direction), the second direction (the Y direction), and the third direction (the Z direction).

FIGS. 6A, 6B, 7A, 7B, 8A, 8B, 9A, 9B, 10A, 10B, 11A, 11B, 12A, 12B, 13A and 13B are views illustrating a method of fabricating a semiconductor device according to an example embodiment.

Specifically, FIGS. 6A, 7A, 8A, 9A, 10A, 11A, 12A and 13A are plan views illustrating the method of fabricating a semiconductor device. FIGS. 6B, 7B, 8B, 9B, 10B, 11B, 12B and 13B are cross-sectional views taken along the line B-B' of FIGS. 6A, 7A, 8A, 9A, 10A, 11A, 12A and 13A, respectively.

Figure 6A:
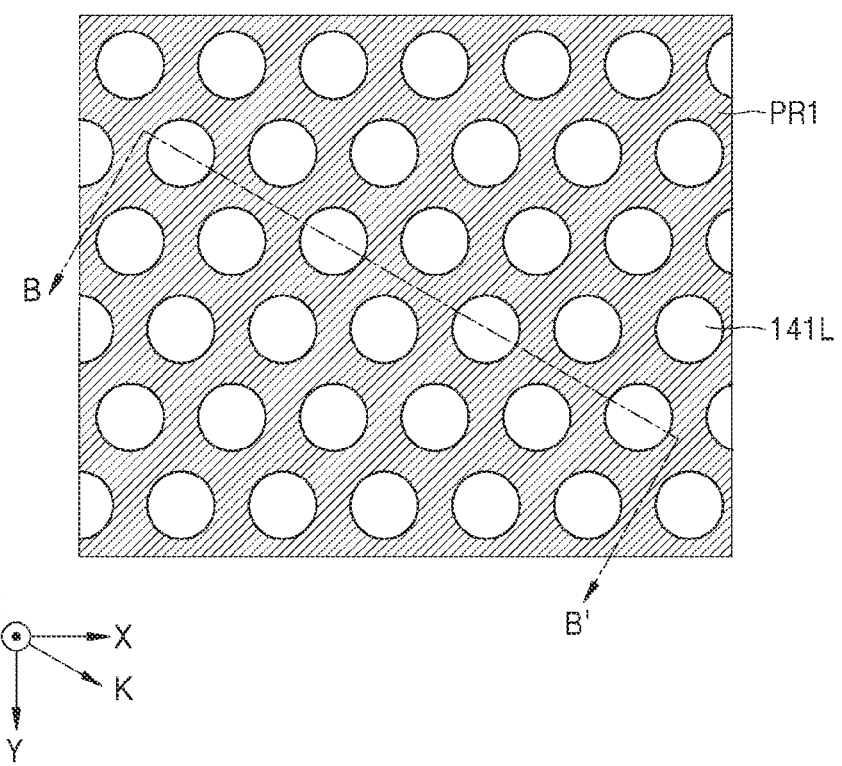
FIGS. 6A, 6B, 7A, 7B, 8A, 8B, 9A, 9B, 10A, 10B, 11A, 11B, 12A, 12B, 13A and 13B are views illustrating a method of fabricating a semiconductor device, according to an example embodiment.
Figure 6B:
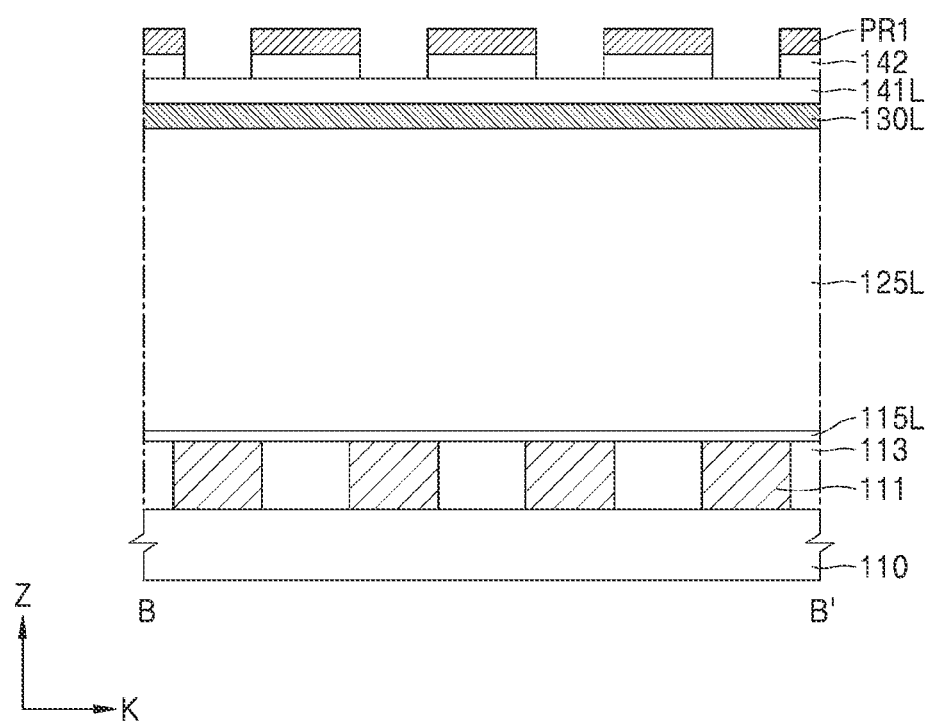

Referring to FIGS. 6A and 6B, after forming the contact plugs 111 in the interlayer insulating layer 113 on the semiconductor substrate 110 and forming an etch stop layer 115L on the upper surfaces of the interlayer insulating layer 113 and the contact plugs 111, a mold layer 125L is formed on an upper surface of the etch stop layer 115L.

The semiconductor substrate 110 may include a semiconductor material such as Si or Ge. In some example embodiments, the semiconductor substrate 110 may include a compound semiconductor material such as SiGe, SiC, GaAs, InAs, or InP.

The mold layer 125L may include silicon oxide. For example, the mold layer 125L may use a material such as boro phosphorous silicate glass (BPSG), spin on dielectric (SOD), phosphorous silicate glass (PSG), low pressure tetra ethyl ortho silicate (LPTEOS), or plasma enhanced tetra ethyl ortho silicate (PE-TEOS). The mold layer 125L may have a thickness of about 500 nm to about 4,000 nm. However, example embodiments are not limited thereto.

Then, a support forming layer 130L is formed on the mold layer 125L. The support forming layer 130L may include, for example, silicon nitride or polysilicon. The support forming layer 130L may have a thickness of about 20 nm to about 150 nm. However, example embodiments are not limited thereto.

Then, a first sacrificial layer 141L is formed on the support forming layer 130L. The first sacrificial layer 141L may include, for example, TEOS, BPSG, PSG, undoped silicate glass (USG), SOD, or high density plasma oxide (HDP) The first sacrificial layer 141L may have a thickness of about 50 nm to about 200 nm. However, example embodiments are not limited thereto.

A second sacrificial layer is formed on the first sacrificial layer 141L, by coating photoresist on the second sacrificial layer and patterning the photoresist by performing exposure and development. After forming the second sacrificial layer, a first photoresist pattern PR1 is formed. By the first photoresist pattern PR1, an area in which a plurality of lower electrodes are to be formed may be defined. For example, openings in the first photoresist pattern PR1 may correspond to areas in which the plurality of lower electrodes are to be formed. The second sacrificial layer may include, for example, silicon oxide, silicon nitride, silicon oxynitride, or polysilicon. In addition, an antireflective coating (ARC) may be formed on the second sacrificial layer.

Then, by etching the second sacrificial layer by using the first photoresist pattern PR1 as an etching mask, a second sacrificial pattern 142 is formed. When the ARC is formed on the second sacrificial layer, an antireflective pattern is formed by etching the ARC.

In some example embodiments, the first photoresist pattern PR1 may be formed by using the EUV exposure apparatus 1000 reflecting the EUV light EL from the EUV photomask PM as previously described with reference to FIGS. 5A and 5B. In other example embodiments, the first photoresist pattern PR1 may be formed by a refractive optical device using ArFi exposure technology.

Figure 7A:
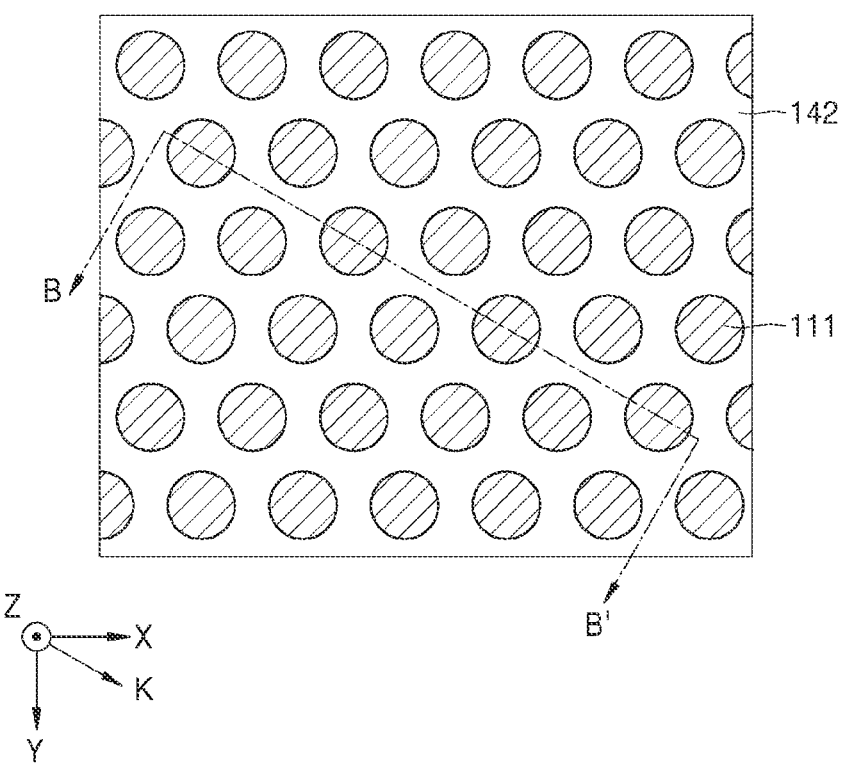
Figure 7B:
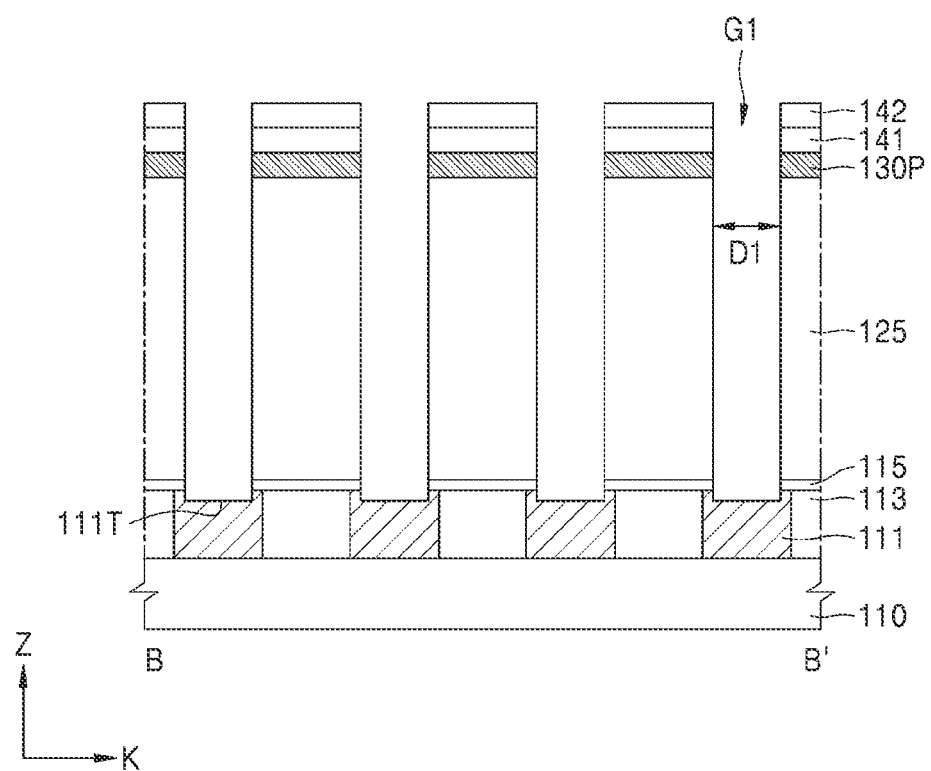

Referring to FIGS. 7A and 7B, the first photoresist pattern PR1 may be removed. After removing the first photoresist pattern PR1 (refer to FIG. 6B), the first sacrificial layer 141L (refer to FIG. 6B), the support forming layer 130L (refer to FIG. 6B), the mold layer 125L (refer to FIG. 6B), and the etch stop layer 115L (refer to FIG. 6B) are sequentially etched by using the second sacrificial pattern 142 as an etching mask.

Therefore, a plurality of first open holes G1 may be formed and the upper surfaces of the contact plugs 111 may be exposed through the plurality of first open holes G1. Each of the plurality of first open holes G1 may have a first diameter D1. Through the etching, the first sacrificial layer 141L becomes a first sacrificial pattern 141, the support forming layer 130L becomes a support pattern layer 130P, the mold layer 125L becomes a mold pattern 125, and the etch stop layer 115L becomes the etch stop pattern 115.

When the mold layer 125L is dry etched, a width of a lower end of each of the plurality of first open holes G1 is less than a width of an upper end of each of the plurality of first open holes G1. For convenience sake, in FIG. 7B, the plurality of first open holes G1 are illustrated as being perpendicular. In some example embodiments, grooves 111T may be formed in the upper surfaces of the contact plugs 111 by performing over-etching. In other example embodiments, the grooves may not be formed in the upper surfaces of the contact plugs 111.

Figure 8A:
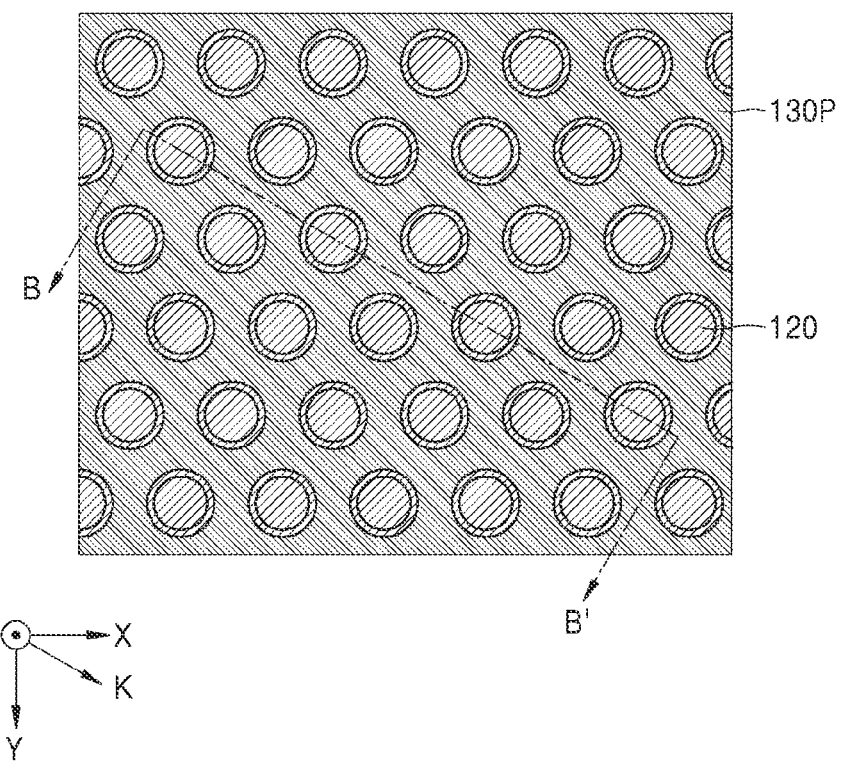
Figure 8B:
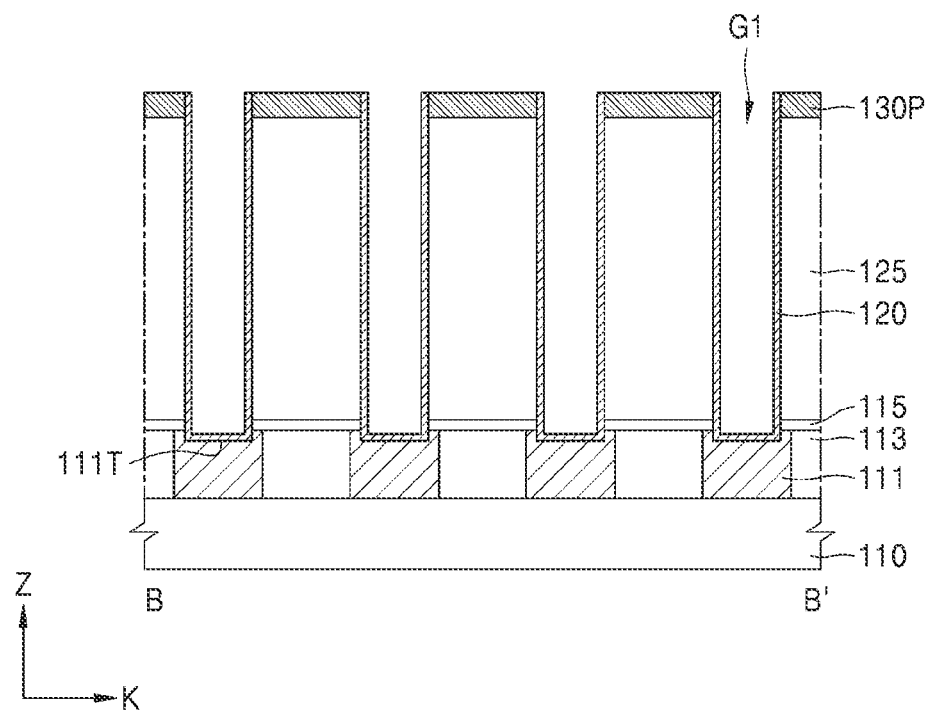

Referring to FIGS. 8A and 8B, the second sacrificial pattern 142 may be removed. After removing the second sacrificial pattern 142 (referring to FIG. 7B), a conductive material to be used as lower electrodes is conformally formed on a whole surface of a resultant material. Then, by performing a node separation process, the plurality of lower electrodes 120 are formed along lower surfaces and side surfaces of the plurality of first open holes G1 to be cylindrical.

A conductive material of which the plurality of lower electrodes 120 are formed may include any one or any combination of metal nitride and metal. The conductive material may include any one or any combination of, for example, TiN, Ru, TaN, WN, Pt, and Ir. The conductive material may be formed by a chemical vapor deposition (CVD) method or an atomic layer deposition (ALD) method to a thickness of about 20 nm to about 100 nm.

In the node separation process, by using an etch-back method or a chemical mechanical polishing (CMP) method, the first sacrificial pattern 141 (refer to FIG. 7B) is also removed. The first sacrificial pattern 141 (refer to FIG. 7B) may protect the support pattern layers 130P while the node separation process is performed.

The plurality of lower electrodes 120 adjacent to one another may be insulated and isolated from one another by the mold pattern 125. When the width of the lower end of each of the plurality of first open holes G1 is less than the width of the upper end of each of the plurality of first open holes G1, such a shape may be transcribed to the plurality of lower electrodes 120. Therefore, a width of a lower end of each of the plurality of lower electrodes 120 is less than a width of an upper end of each of the plurality of lower electrodes 120.

Lower surfaces of the plurality of lower electrodes 120 may be provided in the grooves 111T formed in the upper surfaces of the contact plugs 111 to contact and be stacked on the contact plugs 111. External walls of the upper ends of the plurality of lower electrodes 120 may be fixed to and supported by the support pattern layer 130P.

Figure 9A:
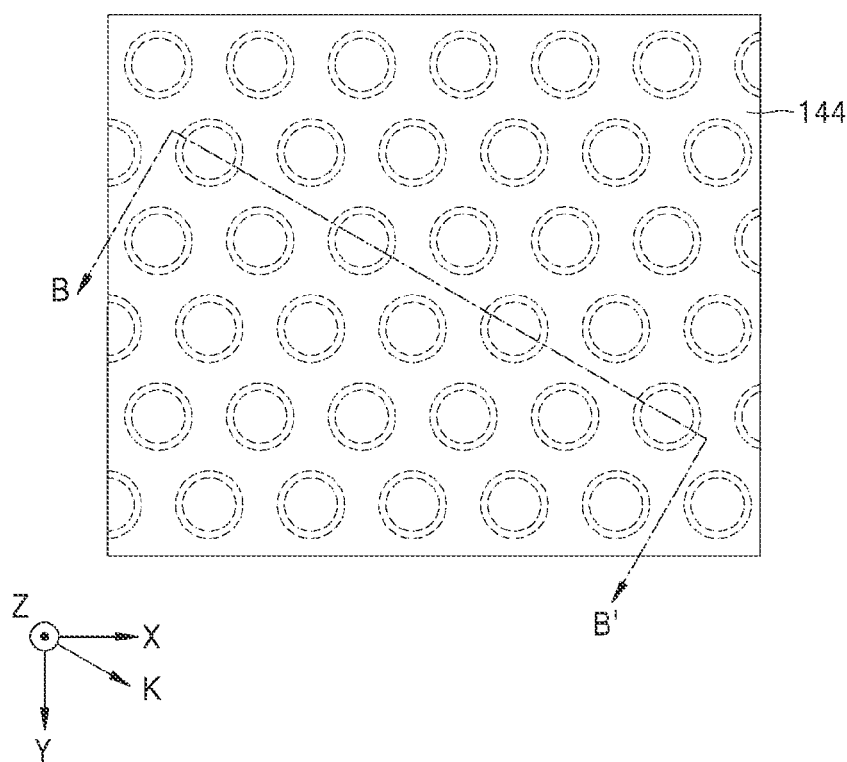
Figure 9B:
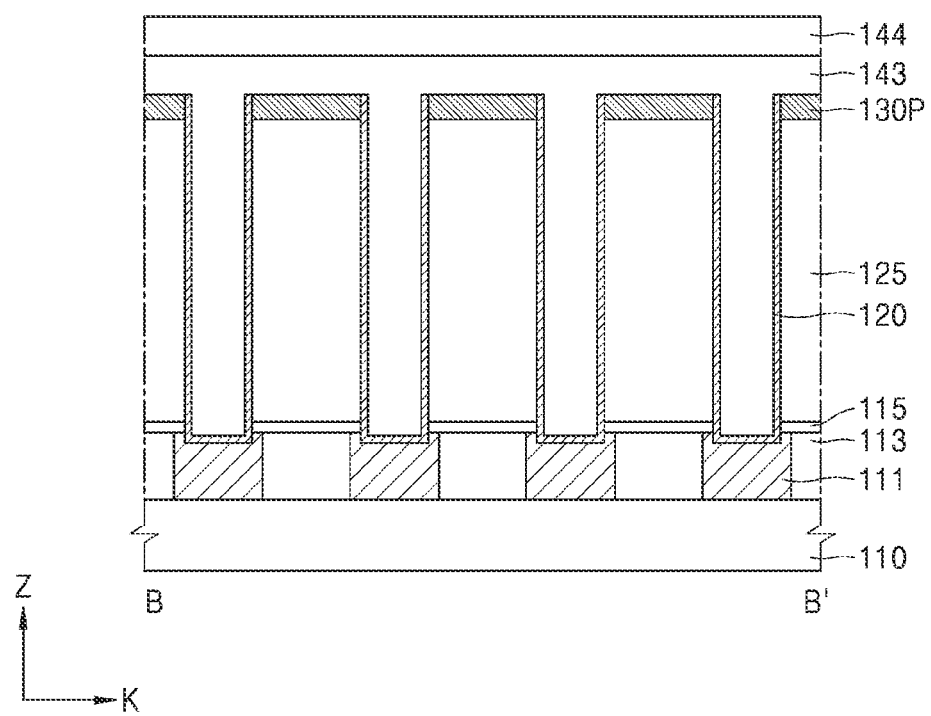

Referring to FIGS. 9A and 9B, a third sacrificial layer 143 is formed on a whole surface of the plurality of lower electrodes 120 and the support pattern layer 130P, and a fourth sacrificial layer 144 is formed on the third sacrificial layer 143.

Here, the third sacrificial layer 143 may include silicon oxide such as TEOS, BPSG, PSG, USG, SOD, or HDP. In addition, the fourth sacrificial layer 144 may include silicon oxide, silicon nitride, silicon oxynitride, or polysilicon. The third sacrificial layer 143 and the fourth sacrificial layer 144 may be formed of materials having different etch selectivities.

Figure 10A:
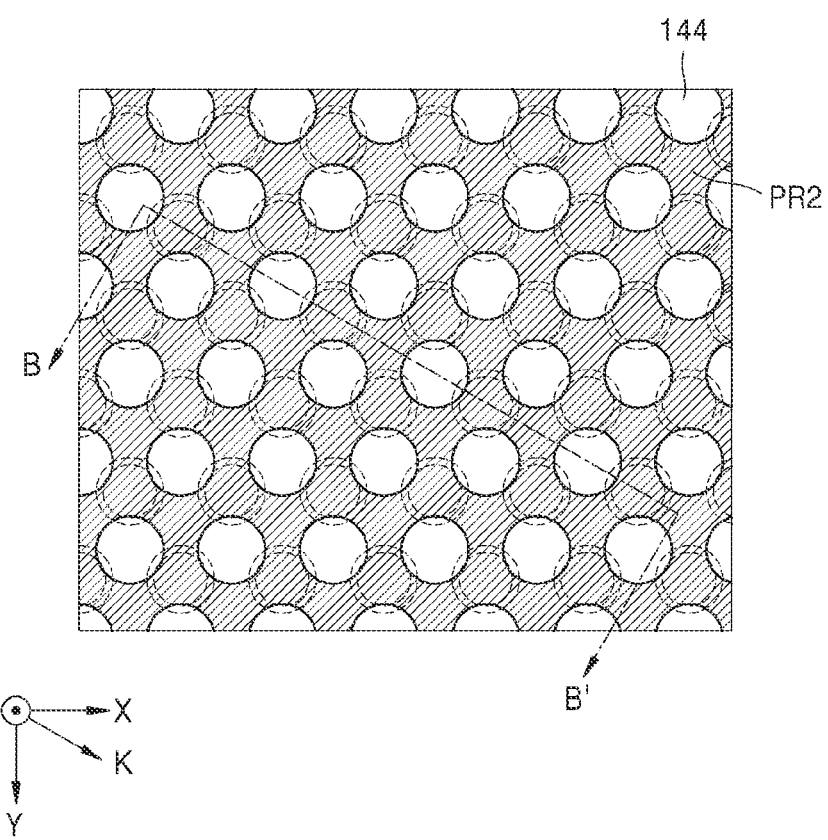
Figure 10B:
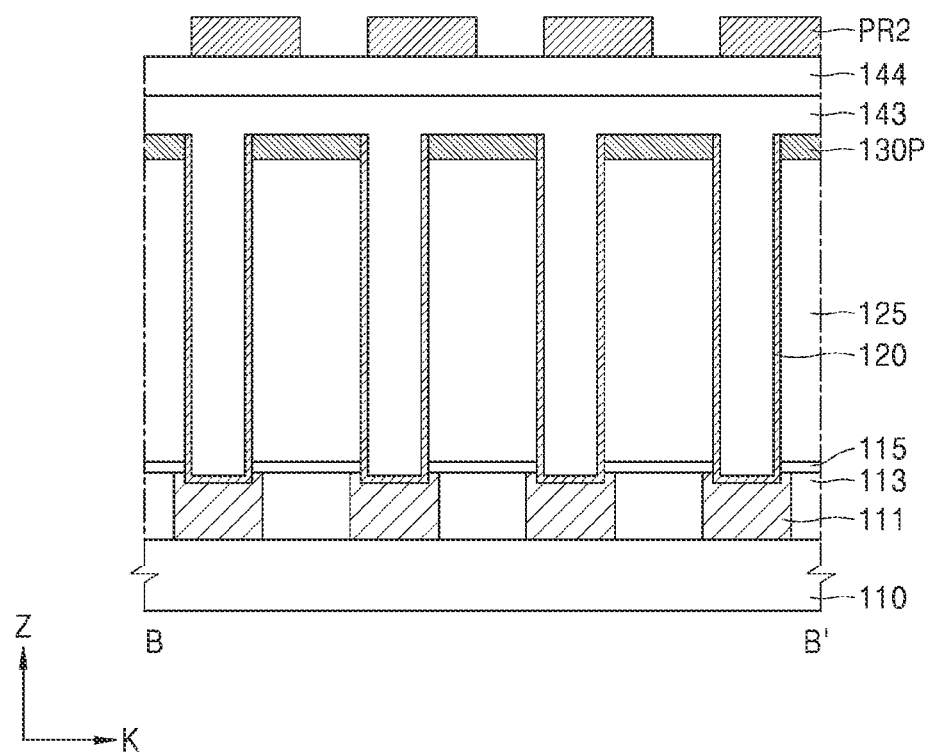

Referring to FIGS. 10A and 10B, by coating photoresist on the fourth sacrificial layer 144 and patterning the photoresist by performing exposure and development, a second photoresist pattern PR2 is formed.

By the second photoresist pattern PR2, an area in which a plurality of open areas are to be formed may be defined. Here, an ARC may be formed on the fourth sacrificial layer 144.

In an example embodiment, the second photoresist pattern PR2 may be formed by using the EUV exposure apparatus 1000 reflecting the EUV light EL from the EUV photomask PM as described with reference to FIGS. 5A and 5B.

Figure 11A:
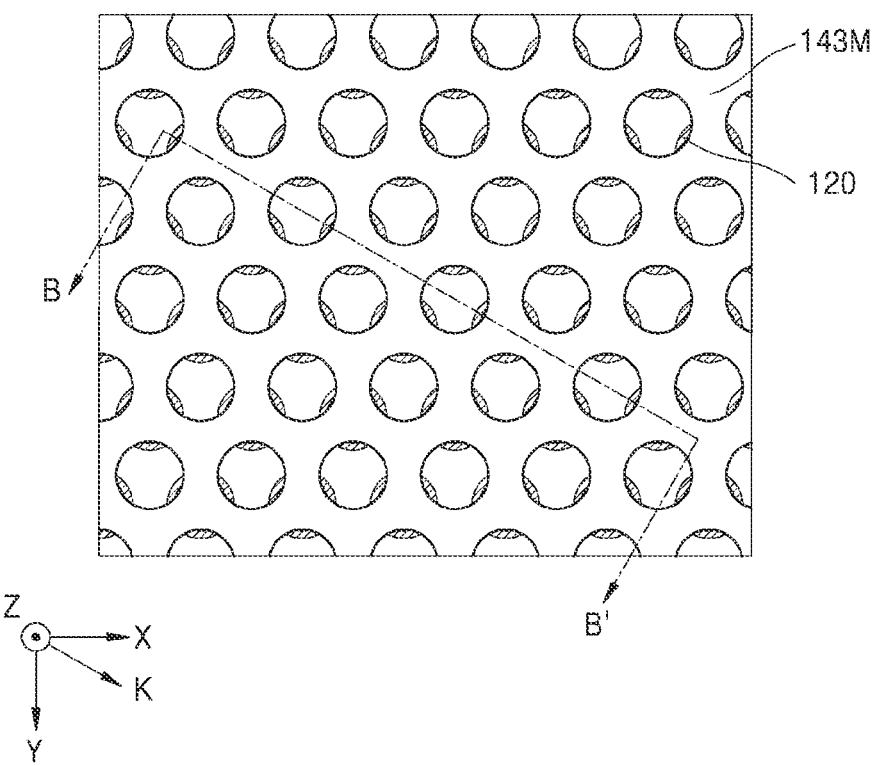
Figure 11B:
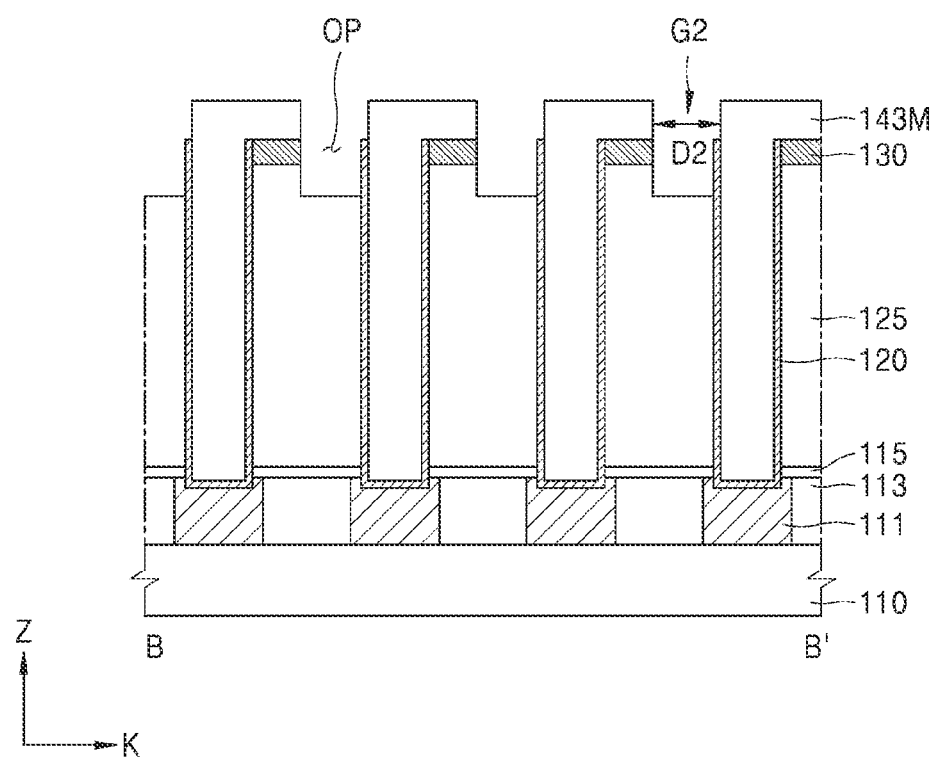

Referring to FIGS. 11A and 11B, the fourth sacrificial layer 144 (refer to FIG. 10B) is etched by using the second photoresist pattern PR2 (refer to FIG. 10B) as an etching mask. Then, by using the fourth sacrificial layer 144 (refer to FIG. 10B) as an etching mask, by etching the third sacrificial layer 143 (refer to FIG. 10B) and etching a portion of the support pattern layer 130P (refer to FIG. 10B), the support 130 including the plurality of open areas OP is formed.

After performing the etching process, the fourth sacrificial layer 144 (refer to FIG. 10B) is removed and the third sacrificial layer 143 (refer to FIG. 10B) becomes a third sacrificial pattern 143M including a plurality of second open holes G2. Each of the plurality of second open holes G2 may have a second diameter D2. In addition, when the support pattern layer 130P (refer to FIG. 10B) is etched, partial surfaces of the plurality of lower electrodes 120 may be exposed.

As described above, by forming the plurality of second open holes G2 and the plurality of open areas OP, during a subsequent wet etching process, a sufficient space into which a wet etching solution may permeate may be formed.

In the semiconductor device 100 (refer to FIG. 1A) according to an example embodiment, the support 130 including the plurality of open areas OP may have a structure in which the wet etching solution may easily permeate into the support 130 during the wet etching process and diffusion paths of a source gas and a reaction gas for forming a dielectric layer may be provided when the following dielectric layer forming process is performed.

That is, in the semiconductor device 100 (refer to FIG. 1A) according to example embodiments, the plurality of lower electrodes 120 are exposed by the plurality of open areas OP in a ratio of 1:1 in a unit area so that the wet etching process may be smoothly performed and high step coverage of a dielectric layer forming process may be secured.

When a portion of the support pattern layer 130P is etched, the plurality of open areas OP are properly secured so that the subsequent process may be smoothly performed as described above while maintaining performance of the support 130. For reference, when the diameter of each of the plurality of open areas OP is greater than required, the performance of the support 130 may deteriorate and, to the contrary, when the diameter of each of the plurality of open areas OP is less than required, the subsequent wet etching process and dielectric layer forming process may deteriorate.

Figure 12A:
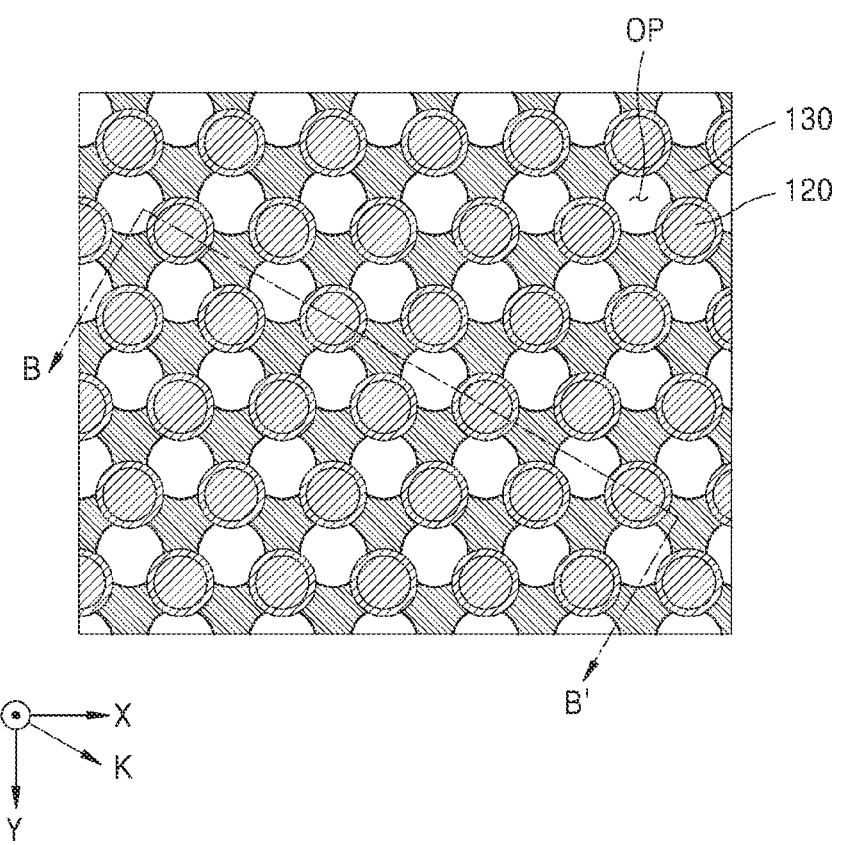
Figure 12B:
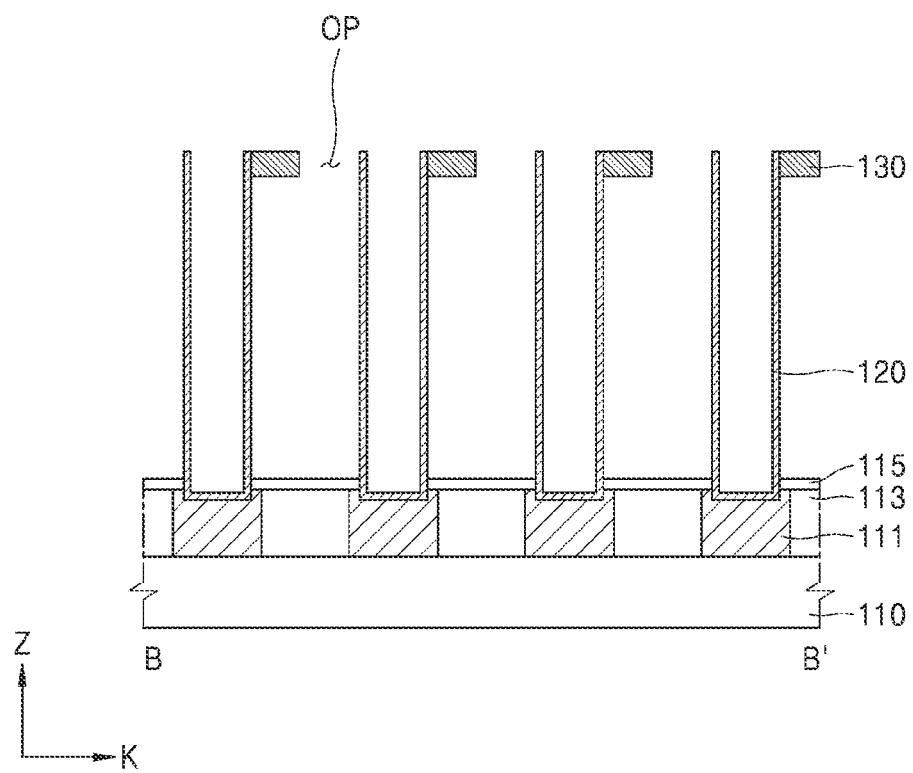

Referring to FIGS. 12A and 12B, the third sacrificial pattern 143M (refer to FIG. 11B) and the mold pattern 125 (refer to FIG. 11B) are removed through the wet etching process.

The mold pattern 125 (refer to FIG. 11B) may include silicon oxide. In this case, the wet etching process may be performed by using a wet etching solution such as hydrofluoric acid or buffered oxide etchant (BOE).

The wet etching solution permeates into the plurality of second open holes G2 (refer to FIG. 12B) formed in the third sacrificial pattern 143M (refer to FIG. 11B) and the plurality of open areas OP formed in the support 130 and wet etches the third sacrificial pattern 143M (refer to FIG. 11B) and the mold pattern 125 (refer to FIG. 11B). That is, when the mold pattern 125 (refer to FIG. 11B) is wet etched, the third sacrificial pattern 143M (refer to FIG. 11B) may be simultaneously removed.

During the wet etching process, the support 130 is not etched. Rather, the support 130 is maintained to firmly fix and support the plurality of lower electrodes 120, and to prevent the plurality of lower electrodes 120 from falling or bending. In addition, the etch stop pattern 115 may prevent the wet etching solution from permeating into the lower ends of the plurality of lower electrodes 120.

As described above, each of the plurality of lower electrodes 120, the plurality of open areas OP, and the plurality of support patterns SP may be arranged in a honeycomb structure. In addition, the plurality of open areas OP may expose the plurality of lower electrodes 120.

Figure 13A:
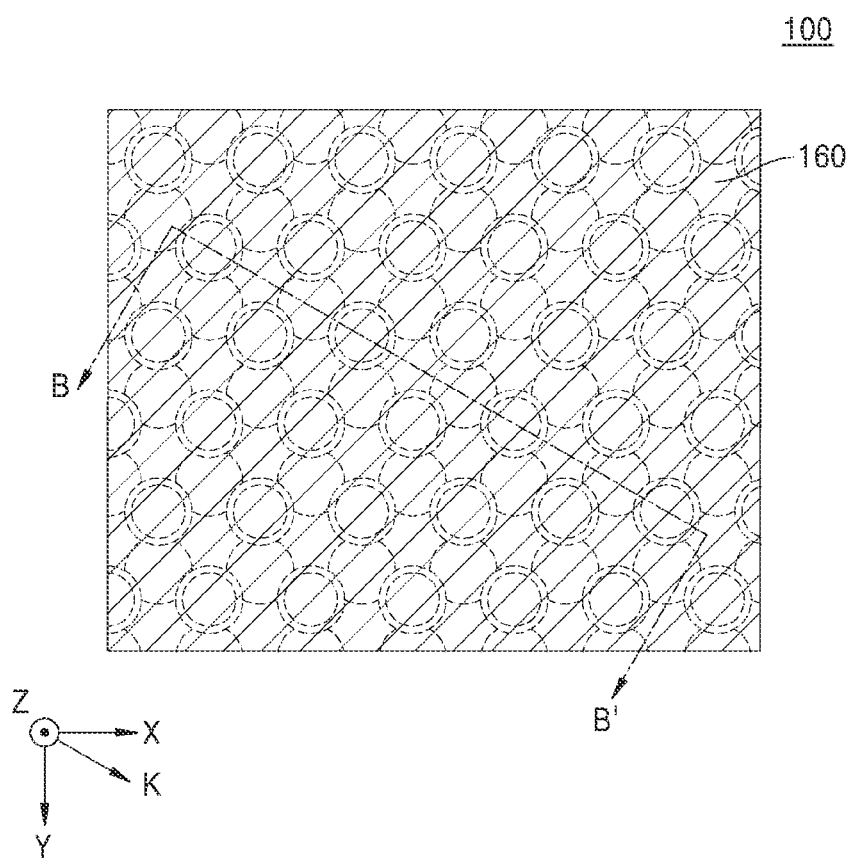
Figure 13B:
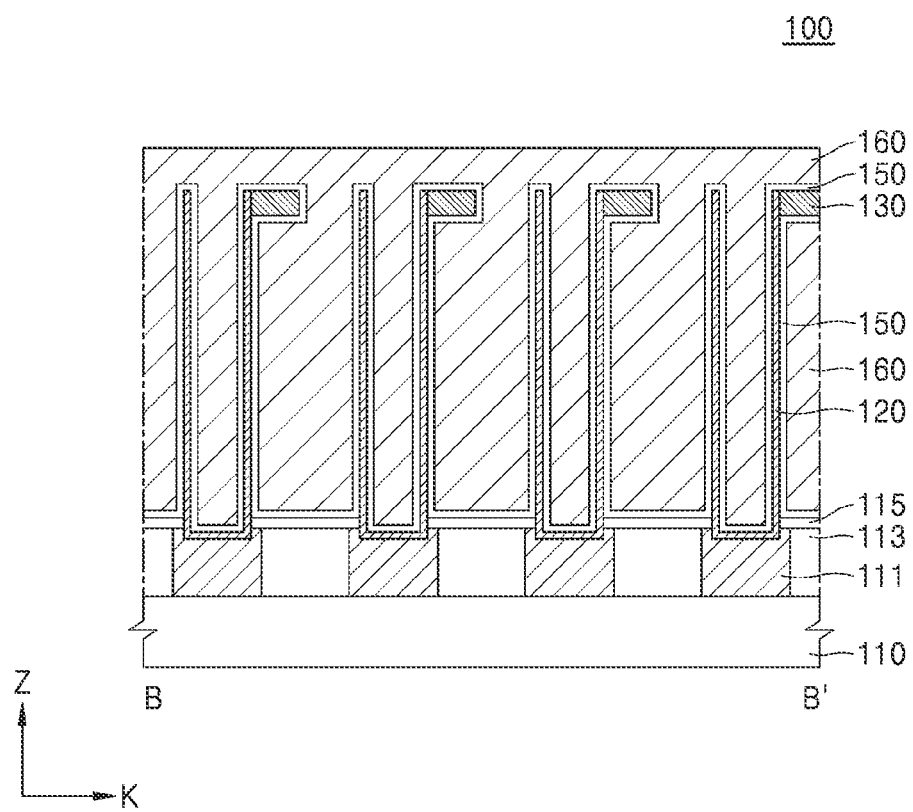

Referring to FIGS. 13A and 13B, the dielectric layer 150 is formed to conformally cover the plurality of lower electrodes 120 and the support 130, and the upper electrode 160 is formed on a whole surface of the dielectric layer 150.

Because the source gas and the reaction gas may be sufficiently supplied through the plurality of open areas OP (refer to FIG. 12B) formed in the support 130, the dielectric layer 150 and the upper electrode 160 may be smoothly and uniformly formed.

The dielectric layer 150 may be conformally formed along the surfaces of the plurality of lower electrodes 120, the surface of the support 130, and the upper surface of the etch stop pattern 115. The dielectric layer 150 may include at least one selected from silicon oxide, silicon nitride, silicon oxynitride, and a high-k material. The dielectric layer 150 may electrically isolate the plurality of lower electrodes 120 from the upper electrode 160 formed in the subsequent process so that the plurality of lower electrodes 120 and the upper electrode 160 may function as a capacitor.

The upper electrode 160 may entirely fill a portion from which the mold pattern 125 (refer to FIG. 11B) and the third sacrificial pattern 143M (refer to FIG. 11B) are removed. A conductive material that becomes the upper electrode 160 may include any one or any combination of metal nitride and metal. For example, the upper electrode 160 may include any one or any combination of TiN, Ru, TaN, WN, Pt, and Ir. The conductive material may be formed by a CVD method or an ALD method.

Through the above-described semiconductor device fabricating processes, the semiconductor device 100 according to example embodiments may be formed. The capacitor may configure a memory cell array of the semiconductor device 100 such as DRAM. The semiconductor device 100 may further include a switching array formed under the capacitor and the switching array may include switching transistors contacting the contact plugs 111.

As a result, the semiconductor device 100 according to an example embodiment may implement the support 130 having a high open ratio by including the support 130 having the plurality of open areas OP each exposing three lower electrodes 120 in order to support the plurality of lower electrodes 120.

Therefore, the performance of the capacitor may improve and the reliability of the semiconductor device 100 may improve. In addition, the semiconductor device fabricating processes according to an example embodiment may implement an ultrafine pattern by using the EUV exposure apparatus 1000 reflecting the EUV light EL from the EUV photomask PM as described above with reference to FIGS. 5A and 5B.

While example embodiments have been particularly shown and described, it will be understood that various changes in form and details may be made therein without departing from the spirit and scope of the following claims.

What is claimed is:

1. A method of fabricating a semiconductor device, the method comprising:
   forming contact plugs on a semiconductor substrate;
   forming a mold layer and a support forming layer on the contact plugs;
   forming a plurality of open areas which expose the contact plugs, by etching the mold layer and the support forming layer;
   forming a plurality of lower electrodes along internal walls of the plurality of open areas; and
   forming a support which contacts the plurality of lower electrodes, by etching the support forming layer to define the plurality of open areas through an extreme ultraviolet (EUV) process of reflecting EUV light from an EUV photomask,
wherein a center point of each of the plurality of open areas is at a center point of a triangle formed by center points of three corresponding neighboring lower electrodes among the plurality of lower electrodes.

2. The method of claim 1, wherein the plurality of open areas are arranged in a honeycomb structure,
wherein a hexagon is formed by open areas positioned at vertexes of six neighboring open areas and an open area positioned at a center point of the hexagon,
wherein each of the six neighboring open areas is positioned at a center point of a corresponding one of six hexagons formed by the plurality of open areas, and
wherein each of the six hexagons formed by the plurality of open areas comprises the open area positioned at the center point of the hexagon.

3. The method of claim 1, wherein the plurality of lower electrodes are formed at a first pitch,
wherein the plurality of open areas are formed at a second pitch by an EUV process, and
wherein the first pitch is substantially equal to the second pitch.

4. The method of claim 3, wherein the plurality of lower electrodes are arranged in a first direction with the first pitch and are arranged in a second direction intersecting the first direction with a third pitch that is half of the first pitch.

5. The method of claim 4, wherein, when a distance between center points of two neighboring lower electrodes among the plurality of lower electrodes is about 3.0 minimum lithographic feature sizes (F),
wherein a distance between center points of two neighboring open areas is about 3.0 F in the first direction and about 2.6 F in the second direction.

6. The method of claim 1, wherein three segments of one of the plurality of lower electrodes are exposed by three open areas from among the plurality of open areas in different directions.

7. The method of claim 1, wherein, three lower electrodes are provided within one of the plurality of open areas.

8. The method of claim 1, wherein a ratio between a number of lower electrodes and a number of open areas in a unit area is 1:1.

9. The method of claim 1, wherein the EUV photomask comprises a mask substrate, a reflective multilayer formed on the mask substrate, and an absorption pattern formed on the reflective multilayer.

10. The method of claim 9, wherein the EUV light has a wavelength of about 4 nm to about 124 nm.

11. A method of fabricating a semiconductor device, the method comprising:
forming a plurality of lower electrodes on an upper surface of a semiconductor substrate; and
forming a support which connects the plurality of lower electrodes and defines a plurality of open areas,
wherein a support pattern is repeatedly formed on the support, and
wherein three segments of each of the plurality of lower electrodes are exposed by the plurality of open areas.

12. The method of claim 11, wherein the plurality of lower electrodes are formed at a first pitch,
wherein the plurality of open areas are formed at a second pitch, by an extreme ultraviolet (EUV) process, and
wherein the first pitch is substantially equal to the second pitch.

13. The method of claim 12, wherein a first diameter of each of the plurality of lower electrodes is substantially equal to a second diameter of each of the plurality of open areas.

14. The method of claim 11, wherein the support pattern comprises three side surfaces which contact the plurality of lower electrodes and three side surfaces exposed to the plurality of open areas, and
wherein the three side surfaces which contact the plurality of lower electrodes and the three side surfaces exposed to the plurality of open areas are alternately arranged in a clockwise direction.

15. The method of claim 11, wherein the support pattern is repeatedly arranged in a honeycomb structure,
wherein a hexagon is formed by support patterns positioned at vertexes of six neighboring support patterns and a support pattern positioned at a center point of the hexagon,
wherein each of the six neighboring support patterns is positioned at a center point of a corresponding one of six hexagons formed by the six neighboring support patterns, and
wherein each of the six hexagons formed by the six neighboring support patterns comprises the support pattern positioned at a center point of the hexagon.

16. A method of fabricating a semiconductor device, the method comprising:
forming a plurality of first conductive lines, wherein the plurality of first conductive lines are spaced apart from one another in a first direction and a second direction, the first direction and the second direction being parallel with an upper surface of a semiconductor substrate and the second direction intersecting the first direction;
forming channel layers in a matrix on the plurality of first conductive lines;
forming gate electrodes which are disposed on both side walls of each of the channel layers and extend in the first direction;
forming gate insulating layers which surround side walls of the channel layers and are arranged between the channel layers and the gate electrodes;
forming a plurality of capacitors on the channel layers, each of which comprises a lower electrode, a dielectric layer, and an upper electrode; and
forming a support which connects a plurality of lower electrodes comprising the lower electrode of each of the plurality of capacitors and defines a plurality of open areas through which the plurality of lower electrodes are exposed,
wherein a center point of each of the plurality of open areas is at a center point of a triangle formed by center points of three corresponding neighboring lower electrodes among the plurality of lower electrodes.

17. The method of claim 16, further comprising:
forming contact plugs on the channel layers;
forming an interlayer insulating layer which surrounds side walls of the contact plugs; and
forming an etch stop pattern on the interlayer insulating layer,
wherein the plurality of capacitors are on the contact plugs.

18. The method of claim 16, wherein the plurality of lower electrodes and the plurality of open areas are both arranged in a honeycomb structure.

19. The method of claim 16, wherein the plurality of lower electrodes are formed at a first pitch, by an extreme ultraviolet (EUV) process, wherein the plurality of open areas are formed at a second pitch, by an EUV process, and wherein the first pitch is substantially equal to the second pitch.

20. The method of claim 19, wherein the plurality of lower electrodes are arranged with the first pitch in the first direction and are arranged in the second direction with a third pitch that is half of the first pitch.

* * * * *